(12) United States Patent
Lin et al.

(10) Patent No.: US 10,488,892 B1
(45) Date of Patent: Nov. 26, 2019

(54) PORTABLE MODULE SYSTEM

(71) Applicant: SMART Modular Technologies, Inc., Newark, CA (US)

(72) Inventors: Fong-Long Lin, Fremont, CA (US); Kwang Jin Gooi, Pulau Pinang (MY); Satyanarayan Shivkumar Iyer, Fremont, CA (US)

(73) Assignee: SMART Modular Technologies, Inc., Newark, CA (US)

( * ) Notice: Subject to any disclaimer, the term of this patent is extended or adjusted under 35 U.S.C. 154(b) by 103 days.

(21) Appl. No.: 15/789,041

(22) Filed: Oct. 20, 2017

(51) Int. Cl.
| | | |
|---|---|---|
| *G06F 1/18* | (2006.01) | |
| *G06F 1/20* | (2006.01) | |
| *H05K 7/20* | (2006.01) | |
| *H05K 7/14* | (2006.01) | |
| *H05K 5/00* | (2006.01) | |
| *H05K 5/02* | (2006.01) | |

(52) U.S. Cl.
CPC .............. *G06F 1/183* (2013.01); *G06F 1/206* (2013.01); *H05K 5/0086* (2013.01); *H05K 5/0247* (2013.01); *H05K 7/1418* (2013.01); *H05K 7/1427* (2013.01); *H05K 7/20145* (2013.01); *H05K 7/20154* (2013.01); *H05K 7/20209* (2013.01)

(58) Field of Classification Search
CPC ...... G06F 1/183; G06F 11/2221; G06F 9/541; G06F 1/206; H05K 5/0091; H05K 5/0247; H05K 5/0282; H05K 5/0065; H05K 7/023; H05K 5/0086; H05K 7/1418; H05K 7/1427; H05K 7/20145; H05K 7/20154; H05K 7/20209
See application file for complete search history.

(56) References Cited

U.S. PATENT DOCUMENTS

| | | | | |
|---|---|---|---|---|
| 5,608,606 A | * | 3/1997 | Blaney ................... | G06F 1/1616 361/679.32 |
| 5,737,194 A | * | 4/1998 | Hopkins .............. | H05K 7/1461 361/728 |
| 5,748,443 A | * | 5/1998 | Flint ....................... | G06F 1/183 361/679.32 |
| 5,784,291 A | * | 7/1998 | Chen ....................... | G06F 15/78 712/32 |
| 5,892,660 A | * | 4/1999 | Farnworth ............. | H01R 12/83 361/728 |
| 8,594,110 B2 | * | 11/2013 | Przybylski .......... | G06F 13/4243 370/403 |

(Continued)

*Primary Examiner* — Dimary S Lopez Cruz
*Assistant Examiner* — Ingrid D Wright
(74) *Attorney, Agent, or Firm* — Wong & Rees LLP; Kirk D. Wong

(57) ABSTRACT

Approaches, techniques, and mechanisms are disclosed for manufacturing and operating portable module systems. The portable module systems can provide additional computing, memory, communication, networking, and power functionality in compact package that can be connected to a host system. The portable module system can dissipate thermal energy using an embedded cooling system to allow the use of high performance components. The portable module system can improve the functionality and computing capacity of the host system by linking off the shelf component boards with the external bus using a bridge interface unit to transfer information from an internal bus to the external bus.

19 Claims, 10 Drawing Sheets

(56) References Cited

U.S. PATENT DOCUMENTS

| | | | |
|---|---|---|---|
| 2004/0212964 A1* | 10/2004 | Belady | H01L 23/36 |
| | | | 361/704 |
| 2011/0201431 A1* | 8/2011 | Meyer | G07F 17/32 |
| | | | 463/46 |
| 2012/0095719 A1* | 4/2012 | Araki | G01K 13/00 |
| | | | 702/130 |
| 2014/0241062 A1* | 8/2014 | Jeseritz | G11C 5/04 |
| | | | 365/185.17 |
| 2015/0018104 A1* | 1/2015 | Hollander | G07F 17/3202 |
| | | | 463/45 |
| 2015/0230365 A1* | 8/2015 | Kaplun | B23P 15/26 |
| | | | 361/689 |

\* cited by examiner

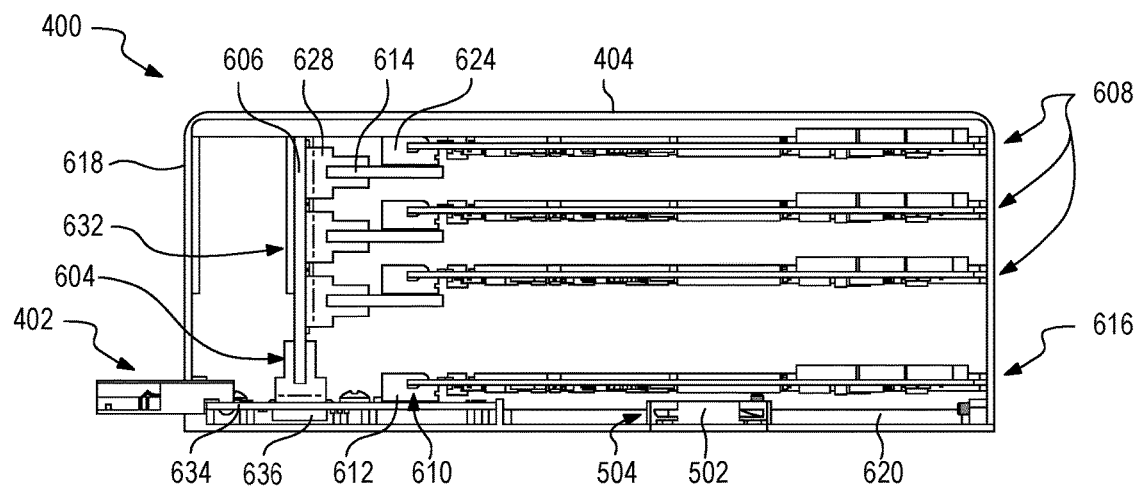
FIG. 7
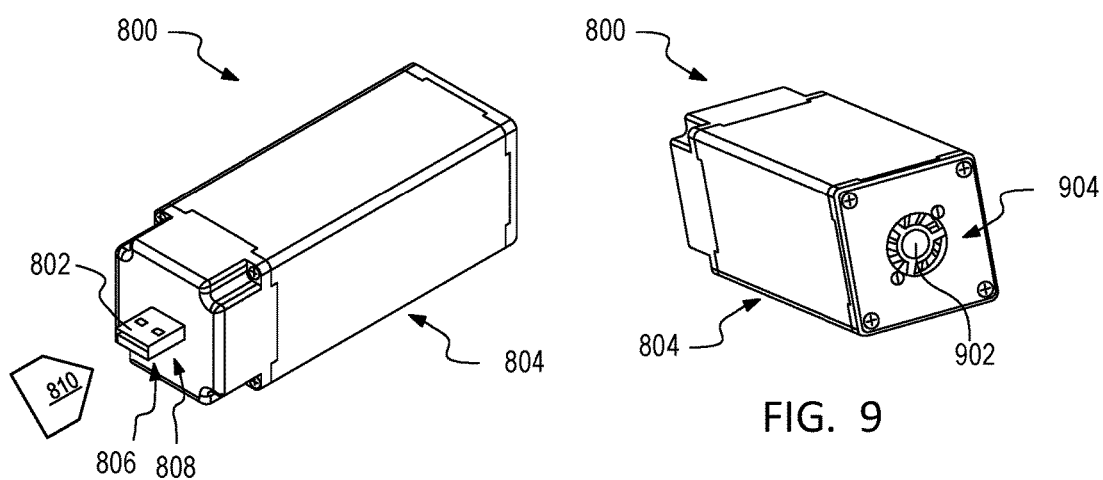
FIG. 8
FIG. 9

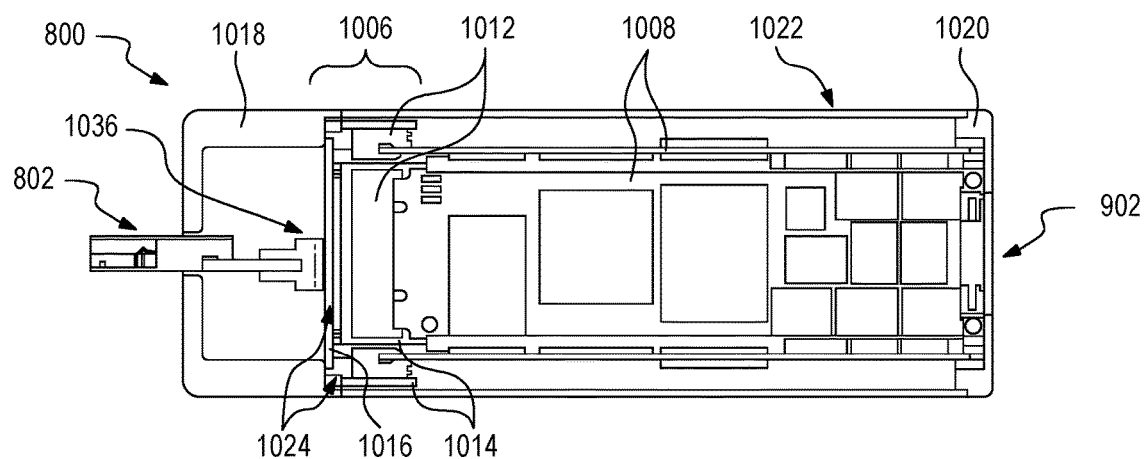
FIG. 11
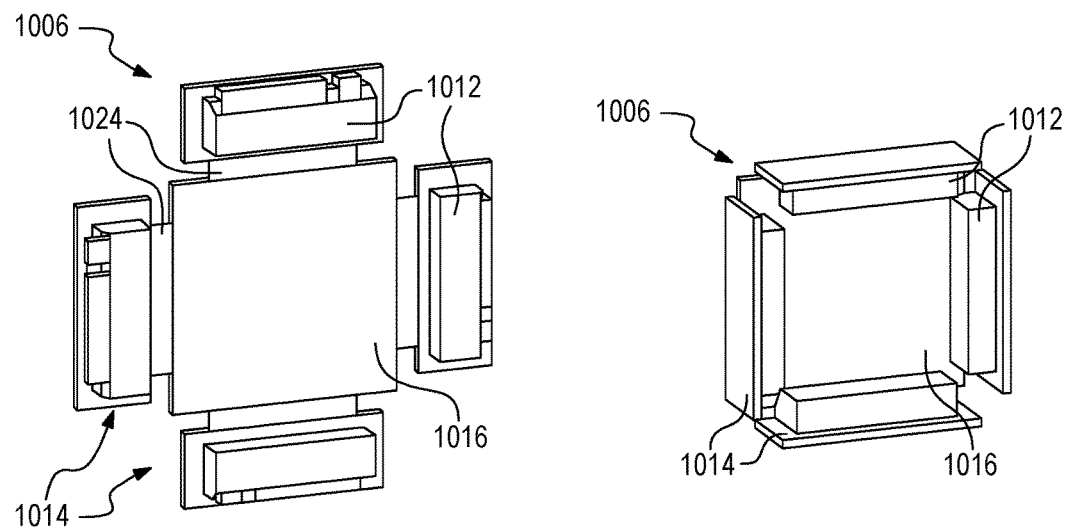
FIG. 12
FIG. 13

PORTABLE MODULE SYSTEM

TECHNICAL FIELD

Embodiments relate generally to computer systems and add-on modules and, more specifically, to systems for combining multiple computer modules for connection to the computer systems.

BACKGROUND

Consumer and industrial electronic systems and devices are increasing in complexity and computation power, and often require additional system resources to keep up with modern, high-powered computer applications. New applications often deal with large amounts of data, thus requiring additional computing power to perform computations in reasonable amounts of time.

Computer system processors and support systems are evolving to provide more computation throughput in smaller packages. Further, many computer systems include parallel architectures and processors to increase the amount of computation power available in a system. Parallel systems increase the number of components and elements to provide the increased computational capacity.

Individual computer chips are being developed with higher density and high transistor counts for the individual devices. Standardization within the industry results in the creation of standardized computing, communication, memory, and display products having ever increasing sizes and capacities. Higher performing components consume larger amounts of energy to support new features and standards.

Modern computer systems require increasingly more computing power and functionality. System often have smaller form factors with limited capacity for additional components. These modern computer systems use the standardized components available for memory storage, computing, communications, and security. Increasing compute power or memory size is often achieved by utilizing higher power computer chips and large capacity memory chips. Such systems provide the compute power to support modern applications.

BRIEF DESCRIPTION OF THE DRAWINGS

The inventive subject matter is illustrated by way of example, and not by way of limitation, in the figures of the accompanying drawings and in which like reference numerals refer to similar elements and in which:

FIG. 7 shows an example of a side view of the external module system in an embodiment;

FIG. 8 shows an example of an isometric front view of an external module system in an embodiment;

FIG. 9 shows an example of an isometric rear view of the external module system;

FIG. 11 shows an example of a side view of the external module system in an embodiment;

FIG. 12 shows an example of an isometric view of the adapter module unit;

FIG. 13 shows an example of a folding step of the assembly of the external module system;

DETAILED DESCRIPTION

Figure 1:
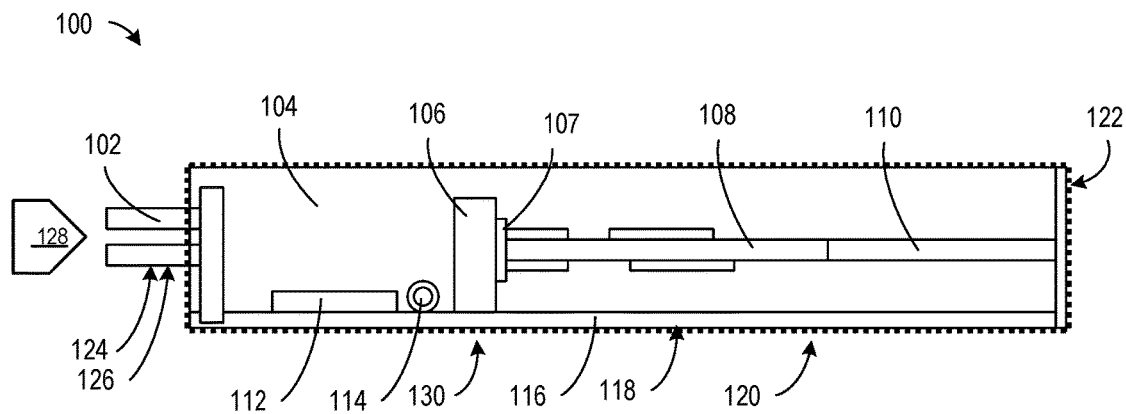
FIG. 1 shows an example of a sealed module system in an embodiment.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present inventive subject matter.

Embodiments are described herein according to the following outline:

1.0. General Overview
2.0. Structural Overview
2.1. Sealed Module System
2.2. Authentication Module System
2.3. External Stacked Module System
2.4. External Module System
2.5. Miscellaneous
3.0. Implementation Mechanism—Hardware Overview
4.0. Functional Overview
4.1. Manufacturing Flow
4.2. Operation Flow
5.0. Example Embodiments
6.0. Extensions and Alternatives

1.0. GENERAL OVERVIEW

Approaches, techniques, and mechanisms are disclosed for manufacturing and operating high density memory systems. According to an embodiment, the portable module system increases the amount of functionality available to a host system by, among other aspects, allowing the connection of additional memory, processor, communication, and power modules using a single bus interface as described herein.

In an embodiment, a portable module system may be configured with an enclosure housing a variety of types of module boards coupled to a system board and an interface connector for attaching to a host system. The module boards can generate substantial amounts of heat, so the sealed module system can be liquid-tight and be filled with a working fluid for cooling the module boards. The outer surface of the enclosure can be configured as a heat sink to help cool the system by dissipating the heat from the internal components. The sealed module system can provide an effective way to add additional functionality using a portable module system that can be attached to an external interface of a host system.

In an embodiment, an authentication module system can provide additional functionality to a host system by coupling an authenticated portable module system to a host system. The authentication module system can be configured with an enclosure exposing an authentication module on the outer surface of the enclosure. The authentication module can receive an authentication value from a user to enable access to the authentication module system. The authentication module system can provide secure access to additional memory, processing, networking, and power modules.

In an embodiment, an external stacked module system can be configured to provide access to high density memory and computing systems by stacking the module boards into a single portable module system. The external stacked module system may be configured with a variety of types of memory, processing, communication, and power modules, and connect them to a single interface connector. The module boards may be implemented in a variety of physical form factors using connector adapters and filler boards to connect to different types of boards. The external stacked module system can include a dedicated cooling unit attached to the enclosure to manage the heat generated by the module boards.

In an embodiment, an external module system can be configured to arrange a plurality of the module boards around an inner perimeter of the enclosure. By positioning the module boards away from one another, the integrated cooling unit can use an internal heat diffuser to channel the airflow against the module boards to maximize cooling capacity.

2.0. STRUCTURAL OVERVIEW

2.1. Sealed Module System

Referring now to FIG. 1, therein is shown an example of a sealed module system 100 in an embodiment. The sealed module system 100 is portable module system for providing an interface to one or more electronic modules coupled together in a sealed enclosure 118. The sealed module system 100 can be filled with a working fluid 104 to provide enhanced cooling to support the electronic modules with high power utilization.

The sealed module system 100 provides a way to combine multiple functional modules into a single connected unit. For example, the sealed module system 100 can be connected to a host system via a universal serial bus connector. The sealed module system 100 can provide a modular mounting configuration the allows different module boards to be attached to an adapter structure and connected to the host system. Further, the sealed module system 100 can be filed with the working fluid 104 to enhance the heat dissipation capacity of the system to support higher powered modules that dissipate more heat energy. The sealed module system 100 can provide high level functionality to the host system in a thermally managed, portable package.

The sealed module system 100 includes an interface connector 102 attached to the sealed enclosure 118. The interface connector 102 allows the sealed module system 100 to be connected to an external bus 128 of a host system (not shown). The interface connector 102 provides access to the data and components within the sealed module system 100. The external bus 128 is a communication interface for transferring data and control information to and from the host system.

The external bus 128 can have a variety of configurations. For example, the external bus 128 can be a Universal Serial Bus (USB), a serial advanced technology attachment (SATA) bus, a mini-SATA (mSATA) bus, a parallel advanced technology attachment (PATA) bus, a small computer system interface (SCSI) bus, a serial attached SCSI interface (SAS), a Peripheral Component Interconnect Express (PCI Express) bus, an Ethernet interface, an inter-integrated circuit (I2C) bus, or another bus interface.

The interface connector 102 can have a variety of configurations. For example, the interface connector 102 can be a USB connector, a SATA connector, a SAS connector, a mini-SATA (mSATA) interface, a PATA connector, a SCSI connector, a PCI Express interface, an Ethernet connector, an I2C connector, or another network or bus connector.

The interface connector 102 can be configured to form a waterproof seal with the sealed enclosure 118 to prevent any leaks of the working fluid 104 that can fill the sealed enclosure 118. This can allow the sealed module system 100 to transfer the heat from higher powered components into the working fluid 104 and then to the sealed enclosure 118 for dissipation. The sealed enclosure 118 can optionally include an enclosure heat sink 120 to increase the amount of heat energy that can be dissipated.

A variety of materials can be used as the working fluid 104. The working fluid 104 can be a liquid having good thermal conductivity properties for transferring heat away from active components in the sealed enclosure 118. For example, the working fluid 104 can be an oil or other liquid substance having low electrical conductivity and high thermal conductivity.

Alternatively, the working fluid 104 can be a gas, such as normal environmental air, nitrogen, or other gas. In cases where the working fluid 104 is a gas, then the sealed enclosure 118 can be airtight and include an opening to allow for the flow of air or gas outside of the enclosure.

Filling the sealed enclosure 118 with the working fluid 104 provides a benefit for a portable system by expanding the number and types of components that can be attached to the host system via the interface connector 102. The working fluid 104 is in direct contact with the internal components and can transfer heat away from the components and to the sealed enclosure 118. The enclosure heat sink 120 can then be used to dissipate the heat into the ambient environment. This allows the sealed module system 100 to include more powerful components that dissipate higher levels of heat.

The sealed enclosure 118 can include the enclosure heat sink 120. The enclosure heat sink 120 is a structure to enhance the dissipation of heat. The enclosure heat sink 120 can be configured in a variety of ways. For example, the enclosure heat sink 120 can be a structure having fins, arms, ridges, or other structural elements. The enclosure heat sink 120 can include a roughed coating to increase the amount of surface area to help dissipate heat. The enclosure heat sink 120 can include ribs, fins, or other protuberances to increase the surface area available for cooling. Attaching the enclosure heat sink 120 to the sealed enclosure allows the sealed module system 100 to operate at higher power levels with more powerful components.

The sealed module system 100 is a modular system of interchangeable components coupled to the interface connector 102. The sealed module system 100 can include a module adapter unit 106 configured to attach to module boards 108.

The module adapter unit 106 is a component coupled to one or more module connectors 107 for attaching to the module boards 108. The module adapter unit 106 provides power and signal transfer from the module boards 108 to the interface connector 102 for communicating with the host system. Although the module adapter unit 106 is shown as a single unit, it is understood that the module adapter unit 106 can have any number of module connectors 107 for mounting different types of the module boards 108.

The module adapter unit 106 can be mounted on a system board 116 installed within the sealed enclosure 118. The system board 116 is a component for interconnecting the components of the sealed module system 100. The system board 116, such as an adapter board, can connect the interface connector 102, the module adapter unit 106, the bridge interface unit 112, the module boards 108, and the power interface 114.

The module boards 108 are components that are attached to the module adapter unit 106. The module boards 108 can be electronic components, such as printed circuit boards, having active and passive elements. For example, the module boards 108 can be solid state drive (SSD) boards, network boards, wireless network boards, power boards, biometric scanner boards, volatile memory boards, non-volatile memory boards, hybrid devices, processor boards, communication boards, or other similar components. The module boards 108 can include elements on one side or both sides of the module boards 108.

The module boards 108 can also include elements for managing the flow of the working fluid 104 within the sealed enclosure 118. The module boards 108 can include boards having baffles, openings, thermal conduction elements, or other passive fluid flow elements. The module boards 108 can include mechanical components such as fans to manage the fluid flow of the working fluid 104.

The module boards 108 can be installed within the sealed enclosure with filler boards 110. The filler boards 110 are components that are mounted behind the module boards 108 to allow the module boards 108 to consistently extend to the end of the sealed enclosure 118. The filler boards 110 can allow each of the module boards 108 to appear to have the same length. This can provide more predictable thermal behavior and allow for more efficient cooling.

The sealed module system 100 can include a bridge interface unit 112 to provide the interface control logic for the interface connector 102. The bridge interface unit 12 is an electrical component for transferring information. The bridge interface unit 112 can couple the interface connector 102 with the other component of the sealed module system 100, such as the module boards 108. The bridge interface unit 112 can provide the logical connectivity with the host system. For example, the bridge interface unit 112 can interface between two different bus protocols.

The bridge interface unit 112 can have a variety of configurations. For example, the bridge interface unit 112 can include a USB interface, PCI Express interface, a SATA interface, a mSATA interface, a SAS interface, a SCSI interface, a USB/SATA bridge interface, a USB 3.0/eSATA to SATA III bridge, or other similar control components.

The bridge interface unit 112 can interface between two different bus protocols. For example, the bridge interface unit 112 can interface between the USB used for connecting to the external system and the off-the-shelf M.2 bus interface of the module boards 108. The bridge interface unit 112 converts the bus protocol used by the module connectors 107 of the module boards 108 to the bus protocol of the interface connector 102. The bridge interface unit 112 can include control logic to manage data and control information, timing, data buffering, and power distribution.

The bridge interface unit 112 enables the use of off-the-shelf components for the module boards 108 to increase flexibility and functionality of the system. The module boards 108 connected to the module connectors 107 can be replaced if damaged or if additional functional capacity is needed. Because the bridge interface unit 112 can interface with components that have a different bus protocol than that used by the interface connector 102, it provides access to wider array of components.

The bridge interface unit 112 can connect components coupled to an internal bus 130 to the external bus 128 via the interface connector 102. The module boards 108 are coupled to the internal bus 130 via the module connectors 107. The module connectors 107 are coupled to the bridge interface unit 112 via the module adapter unit 106.

The module boards 108 are coupled to the bridge interface unit 112 via the internal bus 130. The internal bus 130 is a communication connection for transferring data and control information between components. The internal bus 130 can be a bus for communicating with the module boards 108.

The internal bus 130 can have a variety of configurations. For example, the internal bus 130 can be a serial advanced technology attachment (SATA) bus, a mini-SATA (mSATA) bus, a parallel advanced technology attachment (PATA) bus, a small computer system interface (SCSI) bus, a serial attached SCSI bus (SAS), a Peripheral Component Interconnect Express (PCI Express) bus, an inter-integrated circuit (I2C) bus, or another bus interface.

The bridge interface unit 112 provides an interface between the internal bus 130 and the external bus 128 via the interface connector 102. The module boards 108 are coupled to the internal bus 130 via the module connectors 107. The interface connector 102 can coupled to the external bus 128 of the external host.

The interface connector 102 can include a power line 124 and a data line 126. The power line 124 can transfer power from the host system (not shown) to provide power for the sealed module system 100. The data line 126 can transfer data between the host system and the sealed module system 100. The module adapter unit 106, the system board 116, and the module boards 108 can be powered by the power line 124 of the interface connector 102.

The sealed module system 100 can include a power interface 114 for accessing external power sources for the operation of the module boards 108. The power interface 114 can be a power jack interface, a secondary power source, bus-based power, or a combination thereof. The power interface 114 can be attached directly to the system board 116 and provide power to the components of the sealed module system 100.

The power interface 114 can extend to the outside of the sealed enclosure 118. The power interface 114 can include a waterproof seal to prevent leakage of the working fluid 104. The power interface 114, such as a power jack, can be configured to connect to the external power source while maintaining the waterproof seal.

The sealed module system 100 can include a sealed end cap 122 at the side of the sealed enclosure 118 opposite of the interface connector 102. The sealed end cap 122 is a removable structure that closes off the sealed enclosure 118.

When the sealed end cap 122 is attached to the sealed enclosure 118 it completes the waterproof seal enclosing the working fluid 104.

The sealed end cap 122 can be removed to allow the insertion, removal, and exchange of the module boards 108. The sealed end cap 122 provides the benefit of reconfiguring the sealed module system 100. Once the sealed end cap 122 has been removed, then the sealed module system 100 can be configured with the desired set of module boards 108.

Coupling the module boards 108 using the module adapter unit 106 increases flexibility by providing a variable number of the module connectors 107. Because the module adapter unit 106 can have different configurations, a variety of the module boards 108 can be included in the sealed module system 100 to provide additional functionality.

The sealed module system 100 can have enhanced fault tolerance by installing one of the module boards 108 configured with a power module to provide backup power. The power module can provide power to operate the sealed module system 100 if the power coming from the host system is interrupted.

In another example, because there is space for multiple boards of a single type, the sealed module system 100 can implement a fail-over scheme to switch operation to a backup module board if the primary module board fails. If the system board 116 detects the failure of any of the module boards 108, it can reconfigure the system and make use of the functionality of a duplicate one of the module boards 108.

Configuring the sealed module system 100 with the enclosure heat sink 120 increases the amount of computation and storage capacity. By providing a higher degree of heat dissipation, the module boards 108 can be more powerful and dissipate more heat in the same effective volume.

Figure 2:
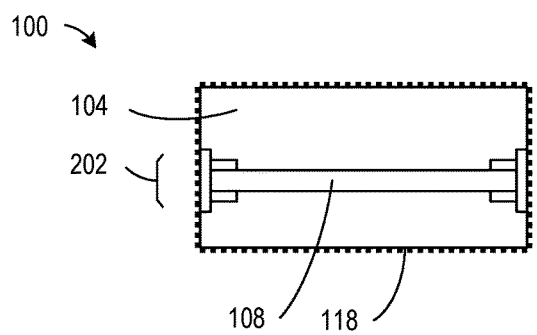
FIG. 2 shows shown an example of an end view of the sealed module system in an embodiment.

Referring now to FIG. 2, therein is shown an example of an end view of the sealed module system 100 in an embodiment. The end view shows the relationship between the module boards 108 and the sealed enclosure 118. The end view shows the sealed module system 100 without the sealed end cap 122 of FIG. 1.

The sealed module system 100 can include module guides 202 to support and correctly position the module boards 108 inside the sealed enclosure 118. The module guides 202 are attached directly to the interior sides of the sealed enclosure 118.

The module guides 202 can be configured as structures having slots sized to receive the module boards 108. The module guides 202 can hold the module boards 108 in position and maintain the separation between the module boards 108. This separation allows for the presence and circulation of the working fluid 104. The working fluid 104 can be in direct contact with the module boards 108 and the sealed enclosure 118.

2.2. Authentication Module System

Figure 3:
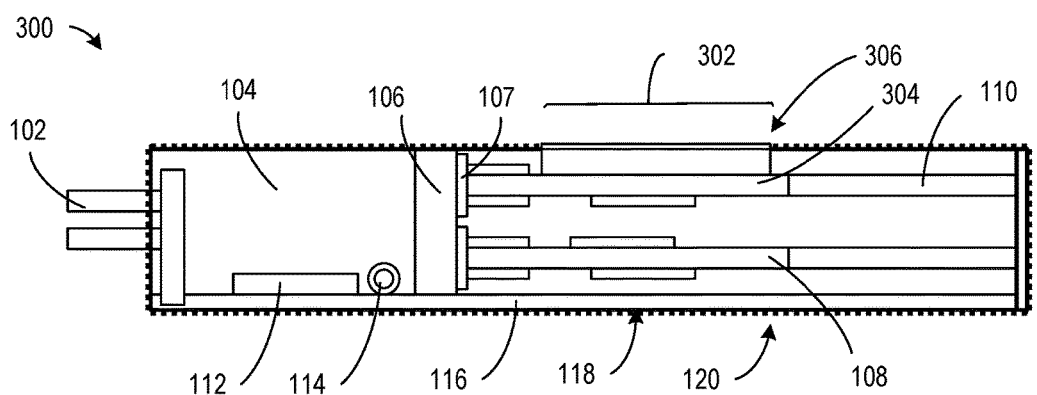
FIG. 3 shows an example of a side view of a sealed authentication module system in an embodiment.

Referring now to FIG. 3, therein is shown an example of a side view of an authentication module system 300 in an embodiment. The authentication module system 300 is a portable module system that can include an authentication sensor 302 on an authentication module 304 within the sealed enclosure 118.

The authentication sensor 302 is a component to allow the entry of authentication information. The authentication sensor 302 can be a biometric sensor, an electro-mechanical sensor, an optical sensor, or a similar type of data collection device. For example, the authentication sensor 302 can be a fingerprint sensor, a touch screen, a chemical sensor, an iris reader, switches, a keypad, a thermal sensor, a capacitive sensor, or a similar type of device.

The authentication module 304 is an electrical component that can be attached to the module adapter unit 106 within the sealed enclosure 118. The authentication module 304 can evaluate input from the authentication sensor 302 to authenticate the use of the authentication module system 300. The authentication module 304 can be one of the module boards 108 coupled to the module adapter unit 106. The authentication module 304 can be extended with one of the filler boards 110 for proper sizing within the system.

The authentication module 304 can operate in a variety of configurations. For example, the authentication module 304 can read a fingerprint using the authentication sensor 302, such as a fingerprint reader, and compare the fingerprint to stored data to authentication the user and allow continued operation of the authentication module system 300. An authentication value 308, such as a fingerprint, numerical code, image, or other similar data element, can be acquired by the authentication module 304 and compared against an access security value 310. If the two values match, then the authentication module 304 can allow access. Otherwise, the authentication module 304 can detect an access error and prevent further operation.

In a further example, the authentication module 304 can receive the authentication value, such as a numerical or alphanumerical code, entered on the authentication sensor 302, such as a keypad or other electromechanical device, and compare the code to a stored authentication key, such as the access security value 310, to authentic the user and allow operation of the authentication module system 300. In another alternative example, the authentication module 304 can receive the authentication value 308, such as an optical bar code or security image, using the authentication sensor 302, such as an optical sensor, and authenticate the user based on the comparison of the optical bar code information with the security access value 310 to determine if access is allowed.

The authentication module system 300 can be configured with additional capacity of the module adapter unit 106 to accommodate the authentication module 304 to be attached to the sealed enclosure 118. The sealed enclosure 118 can include an access port 306 to allow access to the authentication sensor 302. The access port 306 is an opening in the sealed enclosure 118 where the authentication sensor 302 can be installed to provide access to the authentication sensor 302 from the outside.

When the authentication sensor 302 is installed in the access port 306 and then sealed to prevent leakage. In an alternative configuration, the access port 306 can include a covering to allow access to the authentication sensor 302 while still providing a waterproof seal for the sealed enclosure 118. For example, the covering can include a transparent covering for optical sensors, a flexible covering to for keypads, a thermally-transmissive covering for infrared sensors, or similar types of covering and sensor combinations.

The authentication module system 300 is substantially similar to the sealed module system 100 of FIG. 1 and has similar components with similar element numbers. The authentication module system 300 is different from the sealed module system 100 based on the authentication sensor 302 accessible through the sealed enclosure 118 to allow the entry of authentication information.

The authentication module system 300 can be coupled to a host system (not shown) via the interface connector 102. The interface connector 102 is attached to the system board 116. The system board 116 can include the bridge interface unit 112 to control communications with the host system via the interface connector 102. The authentication module system 300 can include the power interface 114 attached to the system board 116.

The authentication module system 300 can be a sealed system filled with the working fluid 104 to improve cooling. The working fluid 104 can transfer heat energy to the sealed enclosure 118 and to the enclosure heat sink 120. The authentication module system 300 can include O-ring seals to prevent leakage.

Coupling the module boards 108 using the module adapter unit 106 increases flexibility by providing a variable number of the module connectors 107. Because the module adapter unit 106 can have different configurations, more of the module boards 108 can be included in the sealed module system 100 to provide additional functionality.

The authentication module system 300 can have enhanced fault tolerance by installing one of the module boards 108 configured to interact with the power module to provide backup power. The power module can provide power to operate the authentication module system 100 if the power coming from the host system is interrupted. For example, the system board 116 can detect the loss of power on the power line 124 and switch to the power module to continue operation.

Configuring the authentication module system 300 with the enclosure heat sink 120 increases the amount of computation and storage capacity. By providing a higher degree of heat dissipation, the module boards 108 can be more powerful and dissipate more heat in the same effective volume.

2.3. External Stacked Module System

Figure 4:
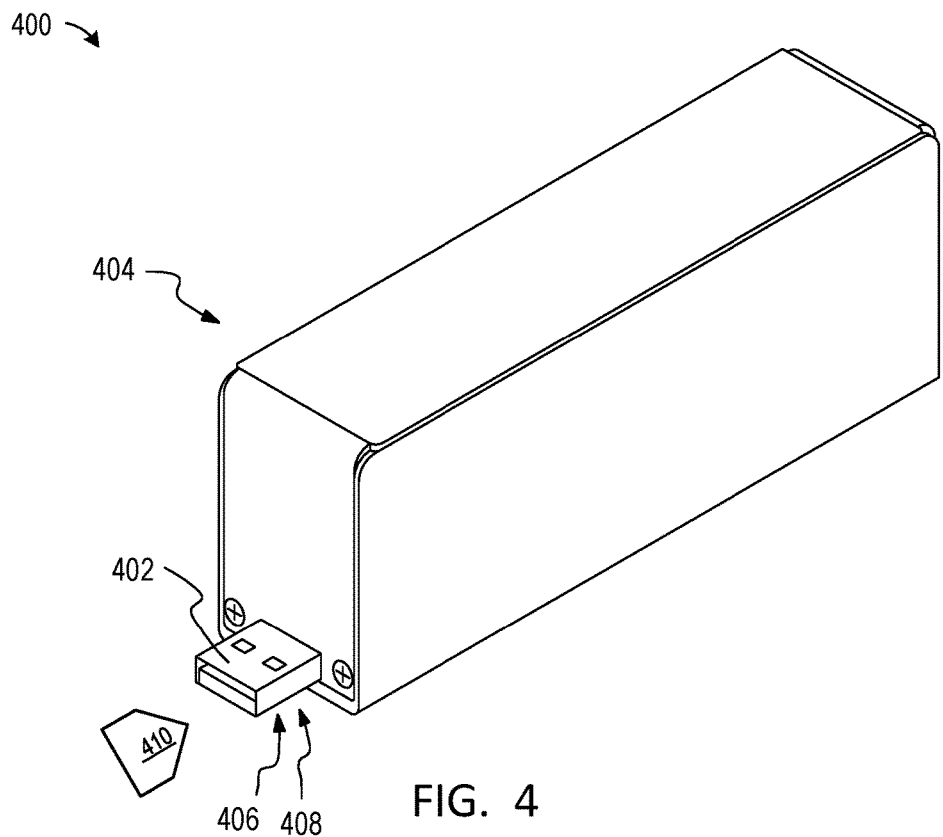
FIG. 4 shows an example of an isometric view of an external module system in an embodiment.

Referring now to FIG. 4, therein is shown an example of an isometric view of an external stacked module system 400 in an embodiment. The external stacked module system 400 is a portable module system that can be attached to a host system (not shown). The external stacked module system 400 can provide additional functionality to the host system in a single package.

The external stacked module system 400 can be connected to an external bus 410 the host system using an interface connector 402 located at one end of the external stacked module system 400. The external bus 410 is a communication interface for transferring data and control information to and from the host system.

The external bus 410 can have a variety of configurations. For example, the external bus 410 can be a Universal Serial Bus (USB), a serial advanced technology attachment (SATA) bus, a mini-SATA (mSATA) bus, a parallel advanced technology attachment (PATA) bus, a small computer system interface (SCSI) bus, a serial attached SCSI bus (SAS), a Peripheral Component Interconnect Express (PCI Express) bus, an Ethernet interface, an inter-integrated circuit (I2C) bus, or another bus interface.

The interface connector 402 can have a variety of configurations. For example, the interface connector 402 can be a USB connector, a SATA connector, a mini-SATA (mSATA) interface, a PATA connector, a SCSI connector, a SAS connector, a PCI Express interface, an Ethernet connector, an I2C connector, or another network or bus connector.

The interface connector 402 can include a power line 406 and a data line 408. The power line 406 can transfer power from the host system (not shown) to provide power for the external stacked module system 400. The data line 408 can transfer data between the host system and the external stacked module system 400.

The external stacked module system 400 can include a system enclosure 404. The system enclosure 404 is a structural component for protecting the external stacked module system 400.

The system enclosure 404 can have a variety of configurations. For example, the system enclosure 404 can be a case formed from metal, plastic, resin, or other materials.

Figure 5:
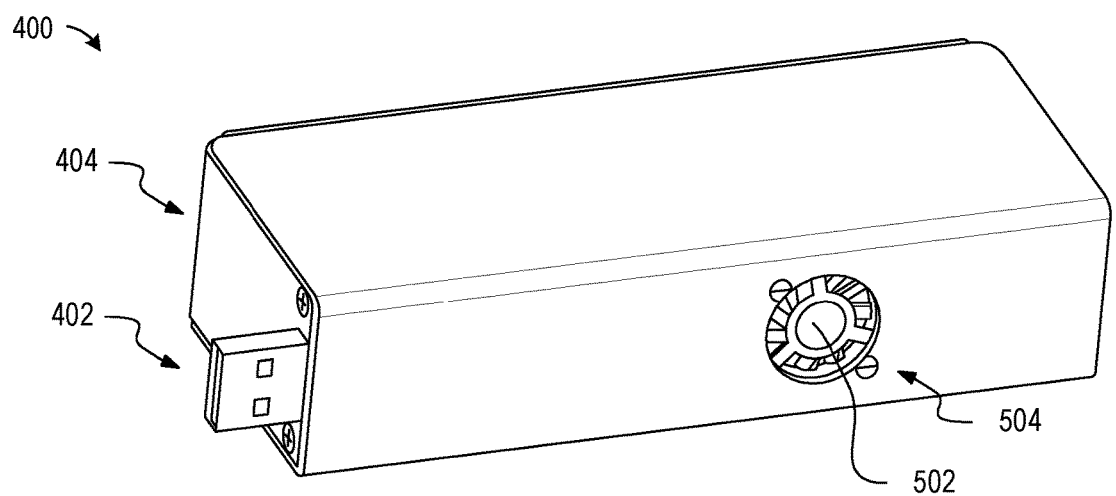
FIG. 5 shows an example of an isometric bottom view of the external module system.

Referring now to FIG. 5, therein is shown an example of an isometric bottom view of the external stacked module system 400. The external stacked module system 400 can provide additional functionality to the host system in a single package.

The external stacked module system 400 is a component that can be attached to a host system (not shown). The external stacked module system 400 can be connected to the host system using the interface connector 402 located at one end of the external stacked module system 400.

The external stacked module system 400 can include a thermal management system that can include a cooling unit 502 on the system enclosure 404. The cooling unit 502 is a component for transferring heat away from the external stacked module system 400. The cooling unit 502 can be mounted to the system enclosure 404 at an enclosure opening 504. The enclosure opening 504 is a hole or gap in the system enclosure 404 to allow the transfer of air from within the system enclosure 404.

The cooling unit 502 can have a variety of configurations. For example, the cooling unit 502 can be a fan, a heat pump, a liquid cooling system, a heat sink, a Peltier thermoelectric cooling system, an electrostatic air moving system, a microfluidics unit, a phase change cooling system, or other system for cooling an electrical system.

The cooling unit 502 can be configured as an intake unit or an exhaust unit. For example, the cooling unit 502 can be used to pull ambient air into the external stacked module system 400 for cooling. The cooling unit 502 can take air from the cooling unit 502, such as an intake fan, and pass the air around and over the components of the external stacked module system 400. After cooling the components, the heated air can be exhausted through openings (not shown) in the external stacked module system 400. For example, heated air can be discharged through the opening of the interface connector 402, through vents in the side of the enclosure, through an additional air moving unit positioned on the external stacked module system 400, or a combination thereof.

The cooling unit 502 can be configured as an exhaust unit, such as an exhaust fan. The cooling unit 502 can pull air from within the external stacked module system 400 and discharge it away from the system. The external stacked module system 400 can receive ambient air from different sources around the external stacked module system 400 such as the interface connector 402, openings (not shown) in the enclosure, an additional air moving unit, or a combination thereof.

Figure 6:
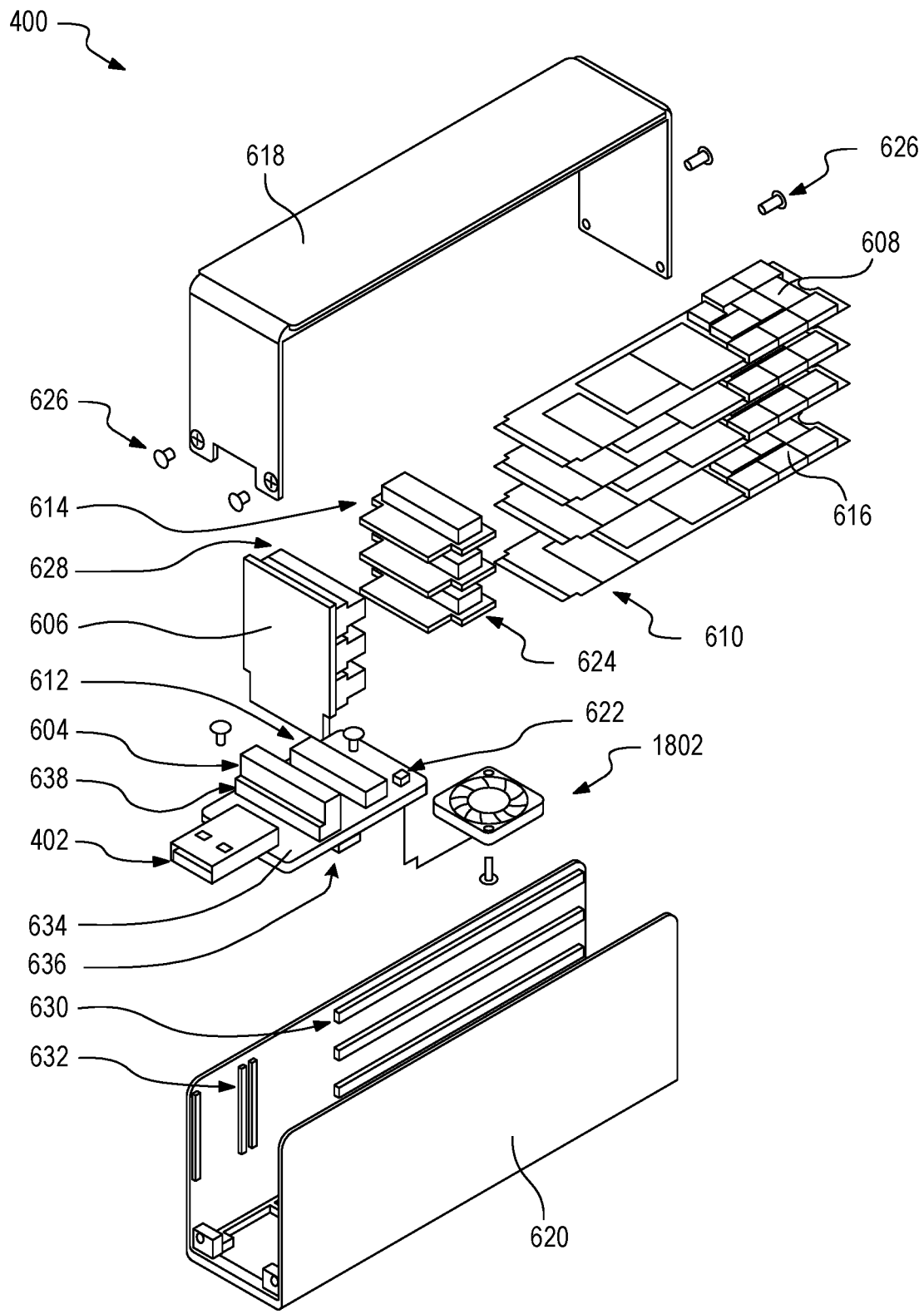
FIG. 6 shows an example of an exploded view of the external module system in an embodiment.

Referring now to FIG. 6, therein is shown an example of an exploded view of the external stacked module system 400 in an embodiment. The external stacked module system 400 is mechanism for providing an interface to one or more electronic modules coupled together in the system enclosure 404 of FIG. 4.

The external stacked module system 400 provides a way to combine multiple functional modules, such as module boards 608, into a single connected unit that is attached to a host computer via an interface. For example, the external stacked module system 400 can be connected to a host system via a universal serial bus connector. The external stacked module system 400 can provide a modular mounting configuration the allows different module boards to be attached to an adapter structure and connected to the host system. Further, the external stacked module system 400 can include a thermal management system to enhance the heat dissipation capacity of the system to support higher powered modules that dissipate more heat energy. The external stacked module system 400 can provide high level functionality to the host system in a thermally managed, portable package.

The external stacked module system 400 includes the interface connector 402 attached to the system enclosure 404. The interface connector 402 allows the external stacked module system 400 to be connected to a host system (not shown). The interface connector 402 provides access to the data and components within the external stacked module system 400.

The interface connector 402 can have a variety of configurations. For example, the interface connector 402 can be a universal serial bus connector, a serial advanced technology attachment (SATA) connector, a mini-SATA (mSATA) interface, a parallel advanced technology attachment (PATA) connector, a small computer system interface (SCSI) connector, a SAS connector, a Peripheral Component Interconnect Express (PCI Express) interface, an Ethernet connector, an inter-integrated circuit (I2C) connector, or another network or bus connector.

The external stacked module system 400 can include the system enclosure 404. The system enclosure 404 is a protective structure covering the external stacked module system 400. The system enclosure 404 can be the base structural component to which other elements are attached. For example, the interface connector 402 can be mechanically attached to the system enclosure 404.

The system enclosure 404 can have a variety of configurations. For example, the system enclosure 404 can be formed by attaching an enclosure top 618 to an enclosure base 620. The enclosure top 618 and the enclosure base 620 can be attached using enclosure fasteners 626. For example, the enclosure fasteners 626 can be screws, rivets, plastic fasteners, welds, or other fastener elements. The enclosure fasteners 626 can be removeable to allow for customization of the system.

The external stacked module system 400 can include the cooling unit 502 installed at the enclosure opening 504 of FIG. 5 to cool the system. This can allow the external stacked module system 400 to transfer the heat from higher powered components out and away from the system for dissipation. The cooling unit 502 can be attached to the system enclosure 404 and have external access though the enclosure opening 504.

The external stacked module system 400 can include an adapter board 634 connected to the interface connector 402. The adapter board 634 is an electrical component for interfacing between the interface connector 402 and other elements of the system.

The adapter board 634 can have a variety of configurations. For example, the adapter board 634 can be a printed circuit board, a flexible circuit unit, or a similar component.

The adapter board 634 can provide an expandable base for attaching the other components of the system. The adapter board 634 can include connectors for removably mounting interface components for the system. The adapter board 634 can include the interface connector 402, an adapter board connector 604, and a system board connector 612. The adapter board 634 can be mounted on the system enclosure 404.

In one embodiment, the adapter board 634 can include a bridge interface unit 636 to provide the interface control logic for the interface connector 402. The bridge interface unit 636 is an electrical component for transferring information. The bridge interface unit 636 can couple the interface connector 402 with the other components of the external stacked module system 400. For example, the bridge interface unit 636 can interface between two different bus protocols.

The bridge interface unit 636 can have a variety of configurations. For example, the bridge interface unit 636 can include a USB interface, PCI Express interface, a SATA interface, a mSATA interface, a SAS interface, a SCSI interface, a USB/SATA bridge interface, a USB 3.0/eSATA to SATA III bridge, or other similar control components.

The bridge interface unit 636 can interface between two different bus protocols. For example, the bridge interface unit 636 can interface between the USB used for connecting to the external system and the off-the-shelf M.2 bus interface of the module boards 608. The bridge interface unit 636 can convert the bus protocol used by the module connectors 624 of the module boards 608 to the bus protocol of the interface connector 402. The bridge interface unit 636 can include control logic to manage data and control information, timing, data buffering, and power distribution.

The bridge interface unit 636 enables the use of off-the-shelf components for the module boards 608 to increase the flexibility and functionality of the system. Because the bridge interface unit 636 can interface with components that have different bus protocols than that used by the interface connector 402, it provides access to wider array of components. The module boards 608 connected to the module connectors 624 can be replaced if damaged or if additional functional capacity is needed.

The bridge interface unit 636 can connect components coupled to an internal bus 638 to the external bus 410 via the interface connector 204. The module boards 608 are coupled to the internal bus 638 via the module connectors 624. The module connectors 624 are coupled to the bridge interface unit 636 via the module adapter unit 606 and the adapter board 634.

The module boards 608 are coupled to the bridge interface unit 636 via the internal bus 638. The internal bus 638 is a communication connection for transferring data and control information between components. For example, the internal bus 638 can be a bus for communicating with the module boards 608.

The internal bus 638 can have a variety of configurations. For example, the internal bus 130 can be a serial advanced technology attachment (SATA) bus, a mini-SATA (mSATA) bus, a parallel advanced technology attachment (PATA) bus, a small computer system interface (SCSI) bus, a serial attached SCSI bus (SAS), a Peripheral Component Interconnect Express (PCI Express) bus, an inter-integrated circuit (I2C) bus, or another bus interface.

The bridge interface unit 636 provides an interface between the internal bus 638 and the external bus 410 via the interface connector 402. The module boards 608 are coupled to the internal bus 638 via the module connectors 624. The interface connector 402 can coupled to the external bus 410 of the external host.

The adapter board 634 can include the system board connector 612 to attach a system board 616. The system board connector 612 is a component for mounting boards and other elements to the adapter board 634.

The system board 616 is a functional module board that can provide control functionality for the external stacked module system 400. The system board 616 can be a printed circuit board having active components such as a bridge interface unit to control data transfer in and out of the external stacked module system 400. For example, the system board 616 can include a processor or controller for operating the external stacked module system 400.

The system board 616 can include module board pins 610 to provide a data and command path to external systems. The system board 616 can be attached to the system board connector 612 by inserting the module board pins 610 into the system board connector 612.

In an alternative embodiment, the system board 616 can include the bridge interface unit 636 to provide the interface control logic for the interface connector 402. The bridge interface unit 636 of the system board 616 can functionally replace the bridge interface unit 636 of the adapter board 634.

Although the system board 616 can have the system control functionality, it is understood that the system can have other configurations. For example, the functionality of the system board 616 can be implemented on the adapter board 634, on a module adapter unit 606, on another one of the module boards 608, or distributed across a combination thereof. In yet another example, the external stacked module system 400 can operate without system control functionality and be controlled externally from the host system.

The cooling unit 502 can be controlled based on a thermal sensor 622. The thermal sensor 622 can be coupled to the cooling unit 502 by a controller cable. The controller cable can also carry power and control the cooling unit 502. In an illustrative example, the thermal sensor 622 can control the speed of a fan by controlling the amount of power transferred by the cable. The thermal sensor 622 can be a thermometer, a thermistor, a thermocouple, an infrared sensor, integrated with the cooling unit 502, or a similar type of temperature detecting sensor.

The cooling unit 502 can be controlled by a controller receiving temperature information from the thermal sensor 622. The controller can be on the system board, on the module adapter unit, on one of the module boards, on the cooling unit, or in a similar location.

The thermal sensor 622 can be positioned in a variety of locations. The thermal sensor 622 can be attached to the module adapter unit 606, the system board 616, one of the module boards 608, on the system enclosure 604, or in another location suitable for determining the temperature within the system.

The adapter board 634 can include the adapter board connector 604 to provide connectivity to the module boards 608. The adapter board connector 604 is an electromechanical component for receiving the module adapter unit 606 having adapter unit connectors 628 for coupling to the module boards 608. In an example, the adapter board connector 604 can be configured to be perpendicular to the surface of the adapter board 634.

The module adapter unit 606 is a component having the adapter unit connectors 628 for attaching to the module boards 608. For example, the module adapter unit 606 can be a printed circuit board with the adapter unit connectors 628 mounted upon it. The module adapter unit 606 can be mounted in the adapter board connector 604 and can have the module boards 608 attached to the adapter unit connectors 628.

The module adapter unit 606 provides power and signal transfer from the module boards 608 to the interface connector 402 for communicating with the host system. Although the module adapter unit 606 is shown as a single unit, it is understood that the module adapter unit 606 can have any number of the adapter unit connectors 628 for mounting different types of the module boards 608.

The adapter unit connectors 628 can be coupled to the module boards 608 with module connectors 624. The module adapter connector boards 614 are circuit boards that can be attached between the adapter unit connectors 628 and the module boards 608.

The module adapter connector boards 614 can include one or more module connectors 624 for coupling with the module boards 608. The module connectors 624 are electromechanical components for receiving the module boards 608.

The module adapter connector boards 614 can provide different types of connector for coupling to the module boards 608. Using the module adapter connector boards 614 allows different module boards 608 to be connected to the module adapter unit 606. In addition, the module adapter connector boards 614 can be used to adjust the spacing and sizing of the module boards 608 within the system. Using the module adapter connector boards 614 increases the flexibility and interoperability of the module boards 608.

The external stacked module system 400 is a modular system of interchangeable components coupled to the host computer via the interface connector 402. The external stacked module system 400 can include one or more of the module boards 608 coupled to the module adapter unit 606, which is coupled to the adapter board 634. The module adapter unit 606, the system board 616, and the module boards 608 can be powered by the power line 406 of the interface connector 402.

The module boards 608 can be connected to module adapter connector boards 614 that are in turn directly attached to the adapter unit connectors 628. Alternatively, the module boards 608 can be directly attached to the adapter unit connectors 628 of the module adapter unit 606. The size and type of the module boards 608 will dictate which configuration is used.

The module boards 608 are functional components that are attached to the module adapter unit 606. The module boards 608 can be electronic components, such as printed circuit boards, having active and passive elements. For example, the module boards 608 can be solid state drive (SSD) boards, network boards, wireless network boards, power boards, biometric authentication boards, volatile memory boards, non-volatile memory boards, hybrid devices, processor boards, communication boards, or other similar components. The module boards 608 can include elements on one side or both sides of the module boards 608. The module boards 608 can be positioned parallel to the other ones of the module boards 608.

The module boards 608 can also act as components for managing the flow of the air within the system enclosure 404. The module boards 608 can include boards having vents, baffles, openings, thermal conduction elements, or other air flow channeling elements. The module boards 608 can also include active components such as fans, heat pumps, thermoelectric tiles, or other mechanisms to manage heat and air flow between the module boards 608 and within the system enclosure 404.

The module boards 608 can be connected to the adapter unit connectors 628 of the module adapter unit 606 or to the module adapter connector boards 614. The module boards 608 can have a pluggable adapter interface at one end of the module boards 608 for attaching to the appropriate connector. For example, the module boards 608 can have the module board pins 610 for attaching to the different connector.

The module adapter connector boards 614 can act as filler boards to normalize the length of the module boards 608. This ensures that the module boards 608 extend the full length of the system enclosure 404 to provide for uniform air flow across the boards. The module adapter connector boards 614 can have different lengths to compensate for differences in sizes of the module boards 608. For example, the module boards 608 can have different lengths for different functionality boards.

Stacking the module boards 608 increases the level of functionality available within the external stacked module system 400. For example, three of the module boards 608 can be memory boards coupled to the system board 616. The system board 616 can include a memory controller which can control the other memory boards. This can increase the effective amount of memory available within the external stacked module system 400 since the memory boards can have additional space dedicated to memory because the memory controller is on the system board 616.

Implementing the system board 616 as a removable module allows the system board 616 to be changed to implement different protocols for connecting with the host system. For example, the system board 616 can be installed that provides a USB interface, a SATA interface, a SAS interface, a SCSI interface, or other similar protocol.

Integrating the cooling unit 502 on the bottom of the system enclosure 404 improves the performance level of the system by reducing the impact of heating on the system components. Directing external air against the system board 616 keeps the control components cooler and preserves system functionality.

Referring now to FIG. 7, therein is shown an example of a side view of the external stacked module system 400 in an embodiment. The side view of the external stacked module system 400 show the coupling between the components of the system.

The external stacked module system 400 provides a way to combine multiple functional modules, such as module boards 608, into a single connected unit that is attached to a host computer via an interface. The external stacked module system 400 can provide high level functionality to the host system in a thermally managed, portable package.

The external stacked module system 400 includes the interface connector 402 attached to the system enclosure 404. The interface connector 402 allows the external stacked module system 400 to be connected to a host system (not shown). The interface connector 402 provides access to the data and components within the external stacked module system 400.

The external stacked module system 400 can include the system enclosure 404. The system enclosure 404 is a protective structure covering the external stacked module system 400. The system enclosure 404 can be the base structural component to which other elements are attached. The system enclosure 404 can be formed by attaching an enclosure top 618 to an enclosure base 620. The enclosure top 618 and the enclosure base 620 can be attached using enclosure fasteners 626 of FIG. 6.

The external stacked module system 400 can include the cooling unit 502 installed at the enclosure opening 504 to cool the system. This can allow the external stacked module system 400 to transfer the heat from higher powered components out and away from the system for dissipation. The cooling unit 502 can be attached to the system enclosure 404 and have external access though the enclosure opening 504.

The external stacked module system 400 can include an adapter board 634 connected to the interface connector 402. The adapter board 634 is an electrical component for interfacing between the elements of the system. The adapter board 634 can have a variety of configurations. For example, the adapter board 634 can be a printed circuit board, a flexible circuit unit, or a similar component. The adapter board 634 can be mounted on the system enclosure 404.

The system board 616 is a functional module board that can provide control functionality for the external stacked module system 400. The system board 616 can be a printed circuit board having active components such as a bridge interface unit to control data transfer in and out of the external stacked module system 400. For example, the system board 616 can include a processor and non-volatile memory to control the external stacked module system 400 including interoperating with the module boards 608.

The adapter board 634 can include the adapter board connector 604 to provide connectivity to the module boards 608. The adapter board connector 604 can receive the module adapter unit 606 having the adapter unit connectors 628 for coupling to the module boards 608. The adapter board connector 604 can be a vertical oriented connector to connect with the module adapter unit 606. The adapter board connector 604 can provide electrical connectivity along the internal bus 638 between the system board 616, the module boards 608, and the interface connector 402.

The module boards 608 can be directly attached to the adapter unit connectors 628 of the module adapter unit 606. Alternatively, the module boards 608 can be connected to module adapter connector boards 614 that are in turn directly attached to the adapter unit connectors 628. Thus, the module boards 608 can be attached to the module adapter unit connectors 628 of the module adapter connector boards 614, which is in turn attached to the adapter unit connectors 628 of the module adapter unit 606.

The module adapter unit 606 is a component having the adapter unit connectors 628 for attaching to the module boards 608. The module adapter unit 606 provides power and signal transfer from the module boards 608 to the interface connector 402 for communicating with the host system.

Further, the module adapter unit 606 can have any number of the adapter unit connectors 628 for connecting to the module boards 608. The external stacked module system 400 can support partial configurations where one or more of the adapter unit connectors 628 can be empty. For example, one or more of the module boards 608 can be removed to reduce the amount of heat produced by the system.

The module adapter connector boards 614 are circuit boards that can be attached between the adapter unit connectors 628 and the module boards 608. The module adapter connector boards 614 can provide a different type of connector for coupling to the module boards 608. Using the module adapter connector boards 614 allows different module boards 608 to be connected to the module adapter unit 606. In addition, the module adapter connector boards 614 can be used to adjust the spacing and sizing of the module boards 608 within the system.

The external stacked module system 400 is a modular system of interchangeable components coupled to the host computer via the interface connector 402. The external stacked module system 400 can include one or more of the module boards 608 coupled to the module adapter unit 606, which is coupled to the adapter board 634.

The module boards 608 are functional components that are attached to the module adapter unit 606. The module boards 608 can be electronic components, such as printed circuit boards, having active and passive elements. For example, the module boards 608 can be solid state drive (SSD) boards, network boards, wireless network boards, power boards, biometric authentication boards, volatile memory boards, non-volatile memory boards, hybrid devices, processor boards, communication boards, power boards, or other similar components. The module boards 608 can include elements on one side or both sides of the module boards 608.

The module boards 608 can also be components for managing the flow of the air within the system enclosure 404. The module boards 608 can include boards having vents, baffles, openings, thermal conduction elements, or other air flow channeling elements. The module boards 608 can include active components such as fans, heat pumps, thermoelectric tiles, or other mechanisms to manage heat and air flow between the module boards 608 and within the system enclosure 404.

The module boards 608 can be inserted in to module guides 630 along the side of the enclosure base 620. The module guides 630 can be slots or supports that help to correctly position the module boards 608. The enclosure base 620 can include vertical guides 632 to correctly position the module adapter unit 606.

The module boards 608 can be connected to the adapter unit connectors 628 of the module adapter unit 606. The module boards 608 can have a plug adapter interface at one end of the module boards 608 for attaching to the appropriate connector. Alternatively, the module boards 608 can be attached to the module adapter connector boards 614 which can function as an interface between the adapter unit connectors 628 and the module boards 608.

The module adapter connector boards 614 can act as filler boards to normalize the length of the module boards 608. This ensures that the module boards 608 extend the full length of the system enclosure 404 to provide for uniform air flow across the boards. The module adapter connector boards 614 can have different lengths to compensate for differences in sizes of the module boards 608. For example, the module boards 608 can have different lengths for different functionality boards.

Coupling the module boards 608 using the module adapter unit 606 increases flexibility by providing a variable number of the adapter unit connectors 628. Because the module adapter unit 606 can have different configurations, more of the module boards 608 can be included in the external stacked module system 400 to provide additional functionality.

The external stacked module system 400 can have enhanced fault tolerance by installing one of the module boards 608 configured with a power module to provide backup power. The power module can provide power to operate the external stacked module system 400 if the power coming from the host system is interrupted.

In another example, because there is space for multiple boards of a single type, the external stacked module system 400 can implement a fail-over scheme to switch operation to a backup module board if the primary module board fails. If the system board 616 detects the failure of any of the module boards 608, it can reconfigure the system and make use of the functionality of a duplicate one of the module boards 608.

Attaching the module boards 608 to the module adapter unit 606 using the module adapter connector boards 614 provides additional flexibility by allowing the use of the module boards 608 having different configurations. The module adapter connector boards 614 can be configured with different types of the module connectors 624 to allow connections to different types of the module boards 608.

Configuring the external stacked module system 400 with the cooling unit 502 increases the amount of computation and storage capacity. By providing a higher degree of cooling than passively cooled systems, the module boards 608 can be more powerful and dissipate more heat. Further, because the module boards 608 can be configured with vents or other openings to facilitate air flow between the module boards 608, the cooling unit 502 can effective cool the entire external stacked module system 400.

The module adapter unit 606 plugs into the adapter board connector 604 mounted on the adapter board 634. Similarly, the system board 616 plugs into the system board connector 612. Because the components are modular, the adapter board 634 can be replaced with one having a different configuration for the interface connector 402. This increases flexibility because the external stacker module system 400 can be reconfigured to connect to a different interface on the host system by switching the interface connector 402.

2.4. External Module System

Referring now to FIG. 8, therein is shown an example of an isometric front view of an external module system 800 in an embodiment. The external module system 800 is a portable module system that provides add-on functionality to a host system (not shown). The external module system 800 can combine a group of module boards together to form a functional unit that can be easily attached to the host system. The external module system 800 can include an integrated cooling system for improving performance.

The external module system 800 can be attached to the existing host system by connecting it to an existing interface of the host system. The external module system 800 can have an interface connector 802 connected to an external bus 810 of the host system (not shown). The interface connector 802 is located at one end of the external module system 800 for attaching to the host system.

The external bus 810 can have a variety of configurations. For example, the external bus 810 can be a Universal Serial Bus (USB), a serial advanced technology attachment (SATA) bus, a mini-SATA (mSATA) bus, a parallel advanced technology attachment (PATA) bus, a small computer system interface (SCSI) bus, a serial attached SCSI bus (SAS), a Peripheral Component Interconnect Express (PCI Express) bus, an Ethernet interface, an inter-integrated circuit (I2C) bus, or another bus interface.

The interface connector 802 can have a variety of configurations. For example, the interface connector 802 can be a USB connector, a SATA connector, a mini-SATA (mSATA) interface, a PATA connector, a SCSI connector, a SAS connector, a PCI Express interface, an Ethernet connector, an I2C connector, or another network or bus connector.

The interface connector 802 can include a power line 806 and a data line 808. The power line 806 can transfer power from the host system (not shown) to provide power for the external module system 800. The data line 808 can transfer data between the host system and the external module system 800.

Although the interface connector 802 is shown as a connector directly attached to the external module system

800, it is understood that other configurations are possible. For example, the interface connector 802 can be attached to the external module system 800 with a cable to allow for easier positioning and attachment. The interface connector 802 can also be a wireless interface, such as Wi-Fi ethernet, Bluetooth, Zigbee, IrDA, or other wireless protocols.

The external module system 800 is protected within a system enclosure 804. The system enclosure 804 is a structural component for protecting the external module system 800. The system enclosure 804 can have a variety of configurations. For example, the system enclosure 804 can be a case formed from metal, plastic, resin, or other materials.

The system enclosure 804 can include vents or other openings for cooling, or can have a sealed configuration that is waterproof or water resistant. The system enclosure 804 can include a heat sink structure or materials to help dissipate heat.

Referring now to FIG. 9, therein is shown an example of an isometric rear view of the external module system 800. The external module system 800 provides additional functionality to the host system in a single package connected via an interface.

The external module system 800 can include a thermal management system that can include a cooling unit 902 on the system enclosure 804. The cooling unit 902 can be located on an end of the external module system 800 opposite from the interface connector 802 of FIG. 8.

The cooling unit 902 is a component for transferring heat away from the external module system 800. The cooling unit 902 can be mounted to the system enclosure 804 at an enclosure opening 904. The enclosure opening 904 is a hole or gap in the system enclosure 804 to allow the transfer of air from within the system enclosure 804.

The cooling unit 902 can have a variety of configurations. For example, the cooling unit 902 can be a fan, a heat pump, a liquid cooling system, a heat sink, a Peltier thermoelectric cooling system, an electrostatic air moving system, a microfluidics unit, a phase change cooling system, or other system for cooling an electrical system.

The cooling unit 902 can be configured as an intake unit or an exhaust unit. For example, the cooling unit 902 can be used to pull or pull air into or out of the external module system 800 for cooling.

The cooling unit 902 can take air from the cooling unit 902, such as an intake fan, and pass the air around and over the components of the external module system 800. After cooling the components, the heated air can be exhausted though openings (not shown) in the external module system 800. For example, heated air can be discharged thought the opening of the interface connector 802, though vents in the side of the enclosure, though an additional air moving unit positioned on the external module system 800, or a combination thereof.

The cooling unit 902 can be configured as an exhaust unit, such as an exhaust fan. The cooling unit 902 can pull air from within the external module system 800 and discharge it away from the system. The external module system 800 can receive ambient air from different sources around the external module system 800 such as the interface connector 802, openings (not shown) in the enclosure, an additional air moving unit, or a combination thereof.

The cooling unit 902 can be coupled with a second cooling unit (not shown) with one unit pulling air in and one unit pushing air out of the system enclosure 804. By using an ingress and egress path for ventilation, the external module system 800 can provide an airflow path that can improve the cooling capacity by increasing total airflow. In an illustrative example, the second cooling unit could be position on the side wall of the system enclosure 804, adjacent to the interface connector 802, or adjacent to the first cooling unit 902.

Figure 10:
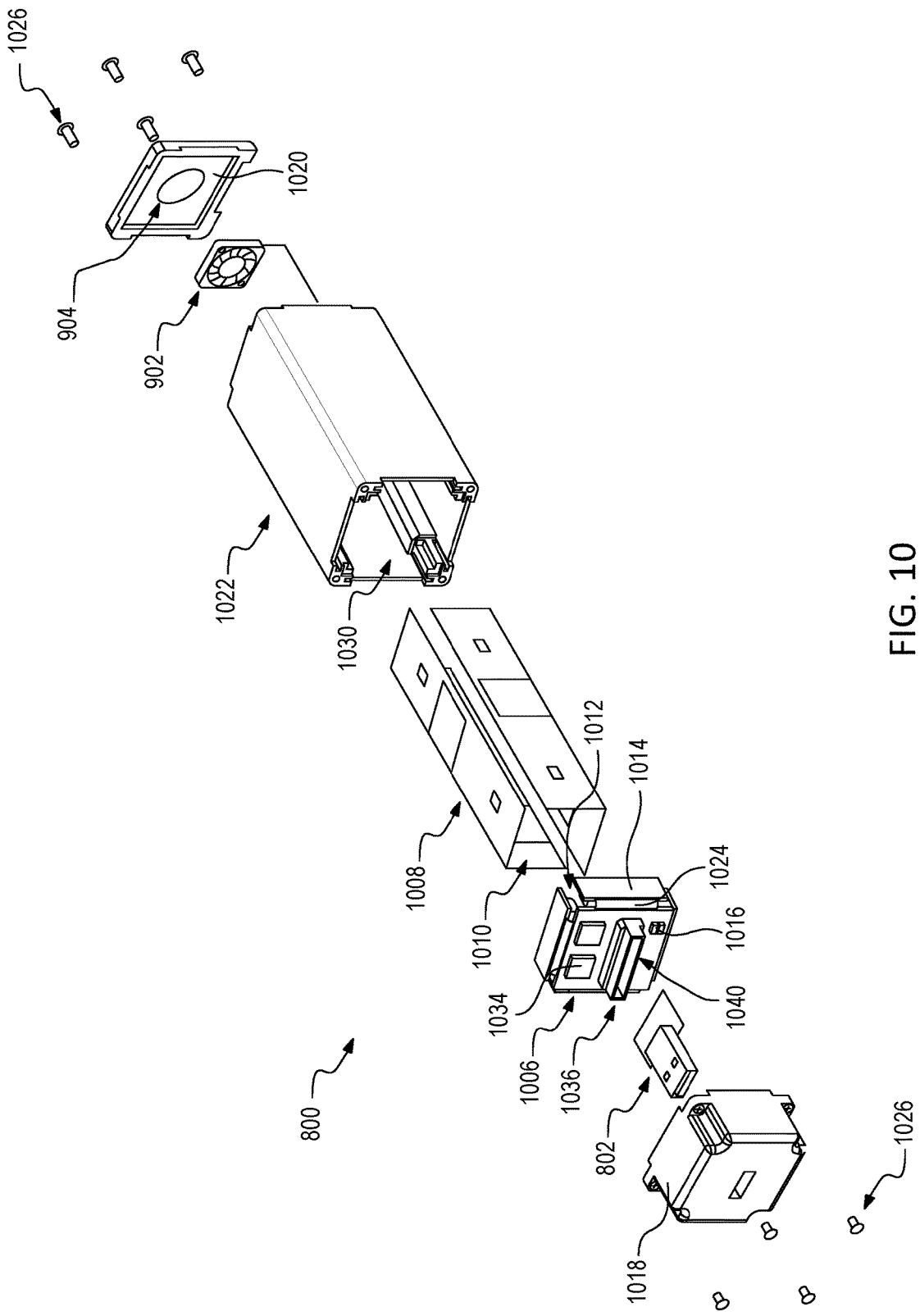
FIG. 10 shows an example of an exploded view of the external module system in an embodiment.

Referring now to FIG. 10, therein is shown an example of an exploded view of the external module system 800 in an embodiment. The external module system 800 is mechanism for providing an interface to one or more functional modules coupled together in a system enclosure 804 of FIG. 8.

The external module system 800 provides a way to combine multiple functional modules, such as module boards 1008, into a single connected unit that is attached to a host computer via the interface connector 802. For example, the external module system 800 can be connected to a host system (not shown) via a universal serial bus connector.

In an illustrative example, the module boards 1008 can be volatile memory boards, non-volatile memory boards, processor or co-processor boards, graphical processing unit boards, power boards, communication boards, user interface boards, security boards, or a combination thereof. The module boards 1008 can be connected to a central module that is connected to the interface connector 802. The host computer can access the functionality and resources of the module boards 1008 via interface supported by the interface connector 802.

The external module system 800 can provide a modular mounting configuration the allows different module boards to be attached to an adapter structure and connected to the host system. Further, the external module system 800 can include a thermal management system to enhance the heat dissipation capacity of the system to support higher powered modules that dissipate more heat energy. The external module system 800 can provide high level functionality to the host system in a thermally managed, portable package.

The external module system 800 includes the interface connector 802 extending from the system enclosure 804. The interface connector 802 allows the external module system 800 to be connected to the host system (not shown). The interface connector 802 provides access to the data and components within the external module system 800.

The interface connector 802 can have a variety of configurations. For example, the interface connector 802 can be a universal serial bus connector, a serial advanced technology attachment (SATA) connector, a mini-SATA (mSATA) interface, a parallel advanced technology attachment (PATA) connector, a small computer system interface (SCSI) connector, a serial attached SCSI interface (SAS), a Peripheral Component Interconnect Express (PCI Express) interface, an Ethernet connector, an inter-integrated circuit (I2C) connector, or another network or bus connector.

The external module system 800 can include the system enclosure 804. The system enclosure 804 is a protective structure covering the external module system 800. The system enclosure 804 can be the base structural component to which other elements are attached. For example, the interface connector 802 can be mechanically attached to the system enclosure 804.

The system enclosure 804 can have a variety of configurations. For example, the system enclosure 804 can be formed by attaching an enclosure front cap 1018 and an enclosure end cap 1020 to an enclosure base 1022. The enclosure front cap 1018 and the enclosure end cap 1020 can be attached to the enclosure base 1022 using enclosure fasteners 1026. For example, the enclosure fasteners 1026 can be screws, rivets, plastic fasteners, welds, or other fastener elements.

The enclosure base 1022 can be a structural element for mounting and protecting system components. The enclosure base 1022 can be formed from plastic, aluminum, resin, metal, composite materials, or other structure materials.

The enclosure base 1022 can include module guides 1030 for supporting and positioning the module boards 1008. The module guides 1030 can be slots on the inner side of the enclosure base 1022 for receiving the sides of the module boards 1008. The module boards 1008 can slide into the module guides 1030 to form a firm mounting connection to the enclosure base 1022.

The enclosure front cap 1018 is a removable structural element attached to the end of the external module system 800 having the interface connector 802. The enclosure front cap 1018 can include an opening for the interface connector 802. The enclosure front cap 1018 can protect the interface connector 802. The enclosure front cap 1018 can optionally be part of a waterproof seal for the system enclosure 804.

The enclosure end cap 1020 is a removable structural element attached to the enclosure base 1022. The enclosure end cap 1020 can include the cooling unit 902 mounted in the enclosure opening 904.

In another example, the enclosure end cap 1020 can optionally be part of a waterproof seal for the system enclosure 804. The enclosure end cap 1020 can be attached to the enclosure base 1022 with an O-ring seal between the two. In this case, the cooling unit 902 can be implemented as a heat sink, a work fluid pump, a thermoelectric cooling device, or a similar type of cooling unit.

The external module system 800 can include the cooling unit 902 installed at the enclosure opening 904 to cool the system. This allows the external module system 800 to transfer the heat from higher powered components out and away from the system for dissipation. The cooling unit 902 can be attached to the system enclosure 804 and have external access though the enclosure opening 904.

The cooling unit 902 can be power and controlled by the external module system 800. For example, the cooling unit 902 can be managed by an environmental controller which can adjust the speed or other cooling capacity parameters of the cooling unit 902 based on the temperature or power level detected by the environmental controller. The environmental controller can be coupled in internal sensor units to detect power, temperature, or other factors.

The external module system 800 can include a module adapter unit 1006. The module adapter unit 1006 is a combined circuit board and connected component for coupling the interface connector 802 with the module boards 1008. The module adapter unit 1006 can include a system board 1016 having flexible connectors 1024 attached to module connector boards 1014. The module connector boards 1014 include module connectors 1012 for coupling to module boards 1008. The system board 1016 can include or implement the environmental controller as a separate device or a process executing on an existing processor or controller unit.

The module adapter unit 1006 provides power and signal transfer from the module boards 1008 to the interface connector 802 for communicating with the host system. Although the module adapter unit 1006 is shown as a single unit, it is understood that the module adapter unit 1006 can have any number of module connector boards 1014 for mounting different types of the module boards 1008.

The module adapter unit 1006 can include the system board 1016 for interfacing between the various elements of the system. The system board 1016 can include the control logic for coupling the functionality of the module boards 1008 to the host system via the interface connector 802. The system board 1016 can include communication, processing, and memory components to provide the required functionality.

The system board 1016 can have a variety of configurations. For example, the system board 1016 can be a printed circuit board, a flexible circuit board unit, or a similar component. The system board 1016 can include the control logic for communicating with the host system through the interface connector 802.

The system board 1016 can include a bridge interface unit 1034 to provide the interface control logic for the interface connector 802. The bridge interface unit 1034 is an electrical component for transferring information. The bridge interface unit 1034 can couple the interface connector 802 with the other component of the external module system 800.

The bridge interface unit 1034 can have a variety of configurations. For example, the bridge interface unit 1034 can be a USB interface, PCI Express interface, a SATA interface, a mSATA interface, a SAS interface, a SCSI interface, a USB/SATA bridge interface, a USB 3.0/eSATA to SATA III bridge, or other similar control components.

The bridge interface unit 1034 can interface between two different bus protocols. For example, the bridge interface unit 1034 can interface between the USB used for connecting to the external system and the off-the-shelf M.2 bus interface of the module boards 1008. The bridge interface unit 1034 converts the bus protocol used by the module connectors 1012 of the module boards 1008 to the bus protocol of the interface connector 802. The bridge interface unit 1034 can include control logic to manage data and control information, timing, data buffering, and power distribution.

The bridge interface unit 1034 enables the use of off-the-shelf components for the module boards 1008 to increase the flexibility and functionality of the system. Because the bridge interface unit 1034 can interface with components that have different bus protocols than that used by the interface connector 802, it provides access to wider array of components. The module boards 1008 connected to the module connectors 1012 can be replaced if damaged or if additional functional capacity is needed.

The bridge interface unit 1034 can connect components coupled to an internal bus 1040 to the external bus 810 via the interface connector 802. The module boards 1008 are coupled to the internal bus 1040 via the module connectors 1012. The module connectors 1012 are coupled to the bridge interface unit 1034 via the module adapter unit 1006.

The module boards 1008 are coupled to the bridge interface unit 1034 via the internal bus 1040. The internal bus 1040 is a communication connection for transferring data and control information between components. For example, the internal bus 1040 can be a bus for communicating with the module boards 1008.

The internal bus 1040 can have a variety of configurations. For example, the internal bus 1040 can be a serial advanced technology attachment (SATA) bus, a mini-SATA (mSATA) bus, a parallel advanced technology attachment (PATA) bus, a small computer system interface (SCSI) bus, a serial attached SCSI bus (SAS), a Peripheral Component Interconnect Express (PCI Express) bus, an inter-integrated circuit (I2C) bus, or another bus interface.

The bridge interface unit 1034 provides an interface between the internal bus 1040 and the external bus 810 via the interface connector 802. The module boards 1008 are coupled to the internal bus 1040 via the module connectors 1012. The interface connector 802 can coupled to the external bus 810 of the external host.

The system board 1016 can have other configurations. Although the system board 1016 is described as being part of the module adapter unit 1006, the functionality of the system board 1016 can be implemented in one of the module boards 1008. For example, the functionality of the system board 1016 can be distributed across several of the module boards 1008.

The system board 1016 can include the interface connector adapter 1036 for coupling with the interface connector 802. The interface connector adapter 1036 is a structural component for coupling to the interface connector 802. The interface connector adapter 1036 can allow changing of the type of connector used as the interface connector 802. For example, the interface connector 802 can be a USB or network connector mounted in the interface connector adapter 1036 that is mounted on the system board 1016.

The module adapter unit 1006 includes the module connector boards 1014 for coupling with the module boards 1008. The module connector boards 1014 are circuit boards that can be attached to the system board 1016 by the flexible connectors 1024.

The module connector boards 1014 can include the module connectors 1012 for mounting the module boards 1008. The module connector boards 1014 can provide a different type of connectors for coupling to different types of the module boards 1008. Using the module connector boards 1014 provides additional flexibility by allowing different type of the module boards 1008 to be connected to the module adapter unit 1006. In addition, the module connector boards 1014 can be used to adjust the spacing and sizing of the module boards 1008 within the system.

The module adapter unit 1006 can be configured in a variety of ways. For example, the module adapter unit 1006 can include four of the module connector boards 1014 attached via the flexible connectors 1024 to four sides of the system board 1016. The flexible connectors 1024 can allow the module connector boards 1014 to be folded at substantially right angles to the system board 1016 to form a square-shaped configuration of the module connectors 1012. This can allow the module boards 1008 to be attached to the module connectors 1012 to form a rectangular tube assembly of the module boards 1008. The rectangular tube configuration supports air flow down the center cavity of the rectangular tube assembly to cool the module boards 1008.

Although the figures show the module boards 1008 forming the rectangular tube configuration, it is understood that other configurations can be used. For example, the module boards 1008 can form a triangular tube configuration, a stacked board configuration, or other board arrangement.

The module adapter unit 1006 can include different configurations of the module connectors 1012 for coupling to the module boards 1008. In one example, the module connectors 1012 are mounted on the module connector boards 1014.

In another example, additional ones of the module connectors 1012 can be mounted perpendicular to the back surface of the system board 1016 to provide the ability to mount the module boards 1008 in a configuration extending directly out from the system board 1016. This can increase the total number of the module boards 1008 that can be connected to the module adapter unit 1006. The module adapter unit 1006 could be configured with four of the module boards 1008 attached to the module connector boards 1014 and two of the module boards 1008 attached to two of the module connectors 1012 that are mounted directly on the back surface of the system board 1016 of the module adapter unit 1006. This could be used to form a three-chambered rectangular tube configuration of the module boards 1008. The three-chambered rectangular tube configuration also support the air flow down the center of each of the chambers to cool the module boards 1008.

Forming the module boards 1008 into a rectangular tube configuration improves the thermal performance of the external module system 800. The module boards 1008 form an assembly having an opening in the middle, allowing the cooling unit 902 access to a larger amount of the surface area of the module boards 1008 and cool the module boards 1008. For example, the cooling unit 902 can blow air into interior of the rectangular tube configuration formed by the module boards 1008 to dissipate heat from the module boards 1008. In another example, the cooling unit 902 can pull air from the interior of the rectangular tube configuration.

The rectangular tube configuration can increase cooling efficiency by directing the air flow directly against the system board 1016. The rectangular tube configuration forms an air flow channel extending from the cooling unit 902 to the system board 1016. In configuration where the system board 1016 includes additional ones of the module boards 1008 attached directly on the system board 1016, the gaps between the module boards 1008 will form channels for guiding the air flow within the system for improved cooling.

The external module system 800 is a modular system of interchangeable components coupled to the host computer via the interface connector 802. The external module system 800 can include one or more of the module boards 1008 coupled to the module adapter unit 1006, which is coupled to the system board 1016.

The module boards 1008 are functional components that are attached to the module adapter unit 1006. The module boards 1008 can be electronic components, such as printed circuit boards, having active and passive elements. For example, the module boards 1008 can be solid state drive (SSD) boards, network boards, wireless network boards, power boards, biometric authentication boards, volatile memory boards, non-volatile memory boards, hybrid devices, processor boards, communication boards, or other similar components. The module boards 1008 can include elements on one side or both sides of the module boards 1008. The module adapter unit 1006, the system board 1016, and the module boards 1008 can be powered by the power line 806 of the interface connector 802.

The module boards 1008 can also be components for managing the flow of the air within the system enclosure 804. The module boards 1008 can include boards having vents, baffles, openings, thermal conduction elements, or other air flow channeling elements. The module boards 1008 can include active components such as fans, heat pumps, thermoelectric tiles, or other mechanisms to manage heat and air flow between the module boards 1008 and within the system enclosure 804.

The module boards 1008 can be connected to the module connectors 1012 of the module adapter unit 1006. The module boards 1008 can have a plug adapter interface at one end of the module boards 1008 for attaching to the appropriate connector. Alternatively, the module boards 1008 can be attached to the module connector boards 1014 which can function as an interface between the module connectors 1012 and the module boards 1008.

The module connector boards 1014 can act as filler boards to normalize the length of the module boards 1008. This ensures that the module boards 1008 extend the full length of the system enclosure 804 to provide for uniform air flow across the boards. The module connector boards 1014 can have different lengths to compensate for differences in sizes of the module boards 1008. For example, the module boards 1008 can have different lengths for different functionality boards.

The cooling unit 902 can be controlled based on a thermal sensor 1038. The thermal sensor 1038 can be coupled to the cooling unit 902 by a controller cable. The controller cable can also carry power and control the cooling unit 902. In an illustrative example, the thermal sensor 1038 can control the speed of a fan by controlling the amount of power transferred by the cable. The thermal sensor 1038 can be a thermometer, a thermistor, a thermocouple, an infrared sensor, integrated with the cooling unit 902, or a similar type of temperature detecting sensor.

The cooling unit 902 can be controlled by a controller receiving temperature information from the thermal sensor 1038. The controller can be on the system board 1016, on the module adapter unit 1006, on one of the module boards 1008, on the cooling unit 902, or in a similar location.

The thermal sensor 1038 can be positioned in a variety of locations. The thermal sensor 1038 can be attached to the module adapter unit 1006, the system board 1016, one of the module boards 1008, on the system enclosure 804, or in another location suitable for determining the temperature within the system.

Coupling the modules boards 1008 to the module adapter unit 1006 using the module connectors 1012 increases module density by providing more of the module connectors 1012 to connect to more of the module boards 1008. Because the module adapter unit 1006 can have different configurations, more of the module boards 1008 can be included in the external module system 800 to provide additional functionality. In addition, additional ones of the module connectors 1012 can be mounted on the system board 1016 of the module adapter unit 1006 and a higher board density can be provided in the same volume.

The external module system 800 can have enhanced fault tolerance by installing one of the module boards 1008 configured with a power module to provide backup power. The power module can provide power to operate the external module system 800 if the power coming from the host system is interrupted.

In another example, because there is space for multiple boards of a single type, the external module system 800 can implement a fail-over scheme to switch operation to a backup module board if the primary module board fails. If the system board 1016 detects the failure of any of the module boards 1008, it can reconfigure the system and make use of the functionality of another one of the module boards 1008.

Configuring the external module system 800 with the cooling unit 902 increases the amount of computation and storage capacity. By providing a higher degree of cooling than passively cooled systems, the module boards 1008 can be more powerful and dissipate more heat. Further, because the module boards 1008 can be configured with vents or other openings to facilitate air flow between the module boards 1008, the cooling unit 902 can effective cool the entire external module system 800.

Configuring the interface connector 802 to be removable from the interface connector adapter 1036 on the system board 1016 of the module adapter unit 1006 improves flexibility. By replacing the interface connector 802, the external module system 800 can be reconfigured to connect to a different communication interface.

Referring now to FIG. 11, therein is shown an example of a side view of the external module system 800 in an embodiment. The external module system 800 is mechanism for providing an interface to one or more electronic modules coupled together in the system enclosure 804 of FIG. 8.

The external module system 800 includes the module boards 1008 attached to the module connectors 1012 of the module connector boards 1014. The module connector boards 1014 are coupled to the system board 1016 of the module adapter unit 1006 with the flexible connectors 1024.

Attaching the module connector boards 1014 to the system board 1016 using the flexible connectors 1024 allows the module boards 1008 to be attached to the module adapter unit 1006 in different positions.

The interface connector 802 is attached to the interface connector adapter 1036 of the system board 1016. The interface connector 802 extends out of an opening of the enclosure front cap 1018. The enclosure front cap 1018 and the enclosure end cap 1020 are attached to the enclosure base 1022.

The cooling unit 902 is mounted to the enclosure end cap 1020. The cooling unit 902 can direct the air flow down the center cavity of the rectangular tube configuration formed by the module boards 1008.

Referring now to FIG. 12, therein is shown an example of an isometric view of the module adapter unit 1006. The module adapter unit 1006 is a component for coupling the module boards 1008 of FIG. 10 to the system board 1016 and ultimately to the interface connector 802 of FIG. 8.

The module adapter unit 1006 includes the system board 1016 attached on four side by the module connector boards 1014 with the flexible connectors 1024. Each of the module connector boards 1014 can include one of the module connectors 1012 for mounting the module boards 1008 of FIG. 10.

The flexible connectors 1024 can be bent in a range of approximately 50 degrees. For example, the flexible connectors 1024 can be bent at substantially right angles to form the module connectors 1012 of the module connector boards 1014 into a rectangular configuration.

The back side of the module adapter unit 1006 can be configured in a variety of ways. The back side of the system board 1016 can be empty or be used to mount additional control components. include additional ones of the module connectors 1012 mounted directly on the back side of the system board 1016 with the receiving end of the module connectors 1012 facing away from the system board 1016. Having the additional one of the module connectors 1012 can increase the functional density of the system by adding more of the module boards 1008 to the module connectors 1012.

Referring now to FIG. 13, therein is shown an example of an adapter folding step of the assembly of the external module system 800 of FIG. 8. The adapter folding step configured the module adapter unit 1006 into a box configuration.

The module adapter unit 1006 is a component for coupling the module boards 1008 of FIG. 10 to the system board 1016 and ultimately to the interface connector 802 of FIG. 8. The module adapter unit 1006 includes the flexible connectors 1024 of FIG. 10 which can be bent at a substantially right angle to form a folded configuration with the module connectors 1012 and the module connector boards 1014 oriented in one direction facing away from the system board 1016. The module boards 1008 can be inserted into the module connectors 1012 of the module adapter unit 1006 to form a rectangular tube configuration.

Folding the module adapter unit 1006 allows the module boards 1008 to form the rectangular tube configuration to facilitate air flow along the module boards 1008. By forming the air flow channel, the module boards 1008 and the system board 1016 can be efficiently cooled by the air flow through the system.

Figure 14:
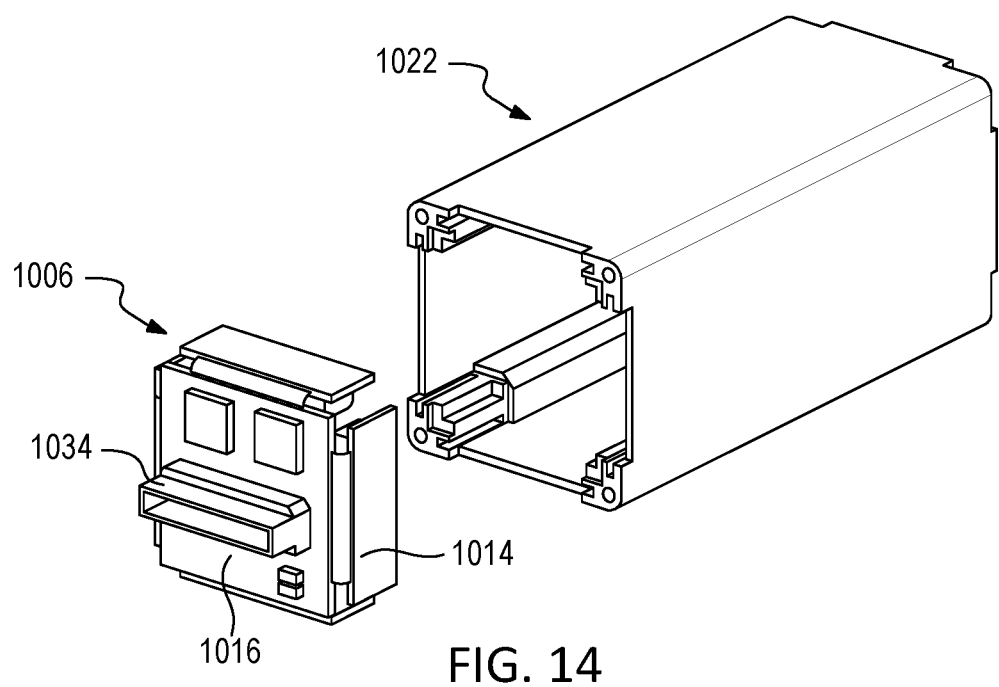
FIG. 14 shows an example of a base mounting step of the assembly of the external module system.

Referring now to FIG. 14, therein is shown an example of an adapter assembly step of the assembly of the external module system 800 of FIG. 8. The adapter assembly step can insert the module adapter unit 1006 in the folded configuration into the enclosure base 1022.

The module adapter unit 1006 can be attached to the enclosure base 1022 using fasteners (not shown). The module connector boards 1014 are inserted into the body of the enclosure base 1022 with the system board 1016 flush with the end of the enclosure base 1022.

The bridge interface unit 1034 is mounted on the side of the system board 1016 facing away from the enclosure base 1022. The bridge interface unit 1034 is configured to receive the interface connector 802 of FIG. 8. The interface connector 802 can be inserted into the bridge interface unit 1034 and protrude away from the body of the enclosure base 1022.

Figure 15:
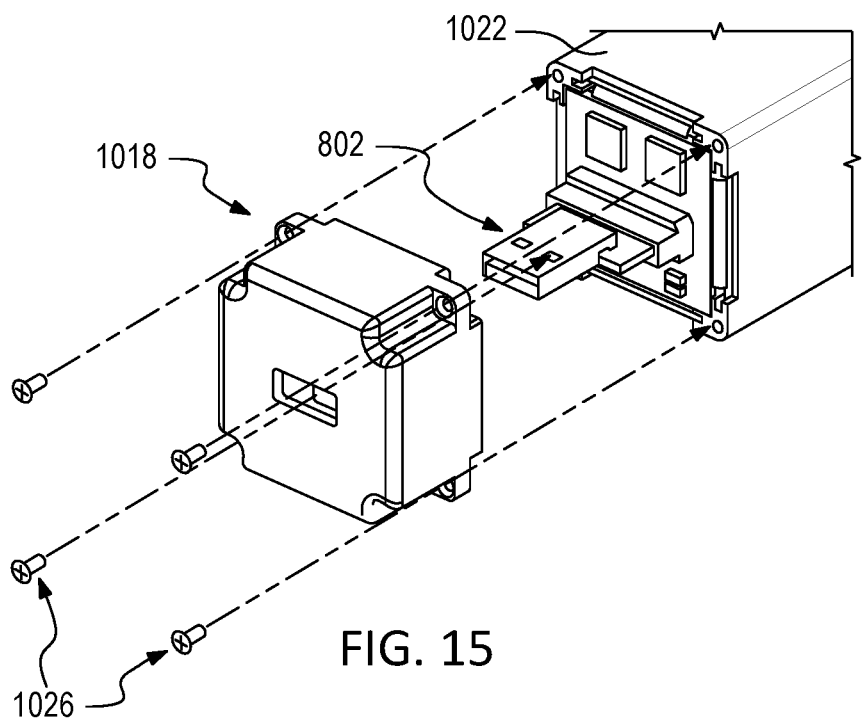
FIG. 15 shows an example of a front cap mounting step of the assembly of the external module system.

Referring now to FIG. 15, therein is shown an example of a front cap mounting step of the assembly of the external module system 800 of FIG. 8. The front cap mounting step can attach the enclosure front cap 1018 to the enclosure base 1022.

The enclosure front cap 1018 can be mounted over the interface connector 802 and attached to the enclosure base 1022 with the enclosure fasteners 1026. The interface connector 802 extends through an opening in the enclosure front cap 1018.

Figure 16:
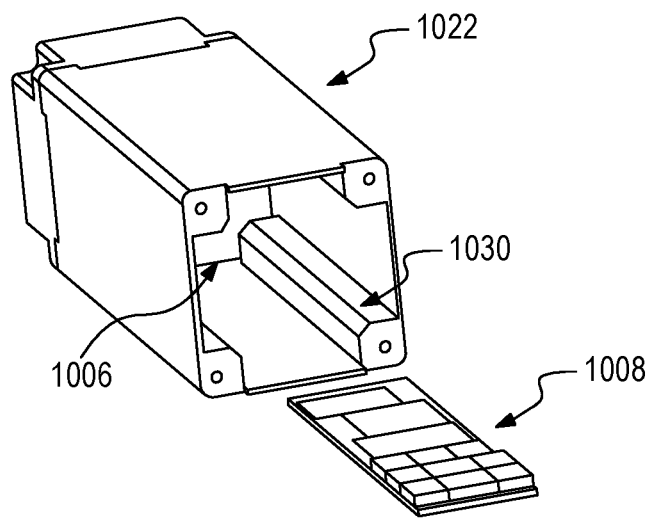
FIG. 16 shows an example of a module mounting step of the assembly of the external module system.

Referring now to FIG. 16, therein is shown an example of a module mounting step of the assembly of the external module system 800 of FIG. 8. The module mounting step shows the attachment of the module boards 1008 into the module adapter unit 1006.

After the module adapter unit 1006 has been attached to the enclosure base 1022, the module boards 1008 can be mounted in the module connectors 1012 of FIG. 10 of the module connector boards 1014 of FIG. 10. The module connectors 1012 are aligned with the module guides 1030 of the enclosure base 1022. This allows the module boards 1008 to be inserted into the module guides 1030 and into the module connectors 1012. Once the module boards 1008 have been inserted into the module connectors 1012, the back end of the module boards 1008 should be flush with the end of the enclosure base 1022.

Figure 17:
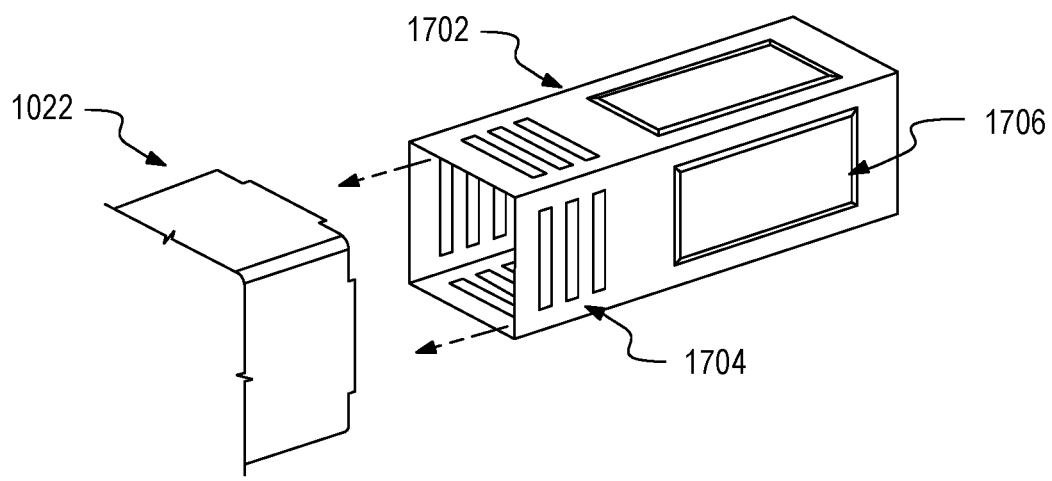
FIG. 17 shows an example of a heat diffuser attachment step of the assembly of the external module system.

Referring now to FIG. 17, therein is shown an example of a heat diffuser attachment step of the assembly of the external module system 800 of FIG. 8. The heat diffuser attachment step is an optional step that can position an internal heat diffuser 1702 within the central cavity of the rectangular tube formed by the installation of four of the module boards 1008 within the enclosure base 1022. Installing the internal heat diffuser 1702 can improve the cooling capacity of the system and help improve processing and storage capacity.

The internal heat diffuser 1702 can be installed within the central cavity of the enclosure base 1022 to improve the cooling capacity of the system. The internal heat diffuser 1702 can use convection or heat conduction to more efficiently allow the cooling unit 902 to cool the modules boards 1008 by transferring heat away from the modules boards 1008. By improving the cooling efficiency of the system, the external module system 800 can use higher performing components and provide a higher level of performance.

The internal heat diffuser 1702 can improve cooling in a variety of ways. For example, the internal heat diffuser 1702 can be a rectangular tube structure that can direct the flow of air from the cooling unit 902 against the module boards 1008. The internal heat diffuser 1702 can include diffuser openings 1704 to selectively channel the air flow. The diffuser openings 1704 can include holes, vents, slots, slits, or other apertures. The diffuser openings 1704 can optionally include mechanisms to direct the air such as fins, blades, paddles, deflectors, vortex generators, winglets, or other elements.

In another example, the internal heat diffuser 1702 can improve cooling placing thermal pads 1706 in direct contact with the components on the module boards 1008. The thermal pads 1706 are thermally conductive structures to transfer heat away from the module boards 1008. The thermal pads 1706 can be made from metal, alloy, ceramic, plastic, resin, or other materials. The thermal pads 1706 can be electrically insulating to reduce the possibility of short circuits. The thermal pads 1706 are on the body of the internal heat diffuser 1702 and can transfer heat from the module boards 1008 to the internal heat diffuser 1702

The internal heat diffuser 1702 can be coupled to the module boards 1008 using a pressure mechanism to press portion of the internal heat diffuser 1702 against the surface of the module boards 1008. Pressing the internal heat diffuser 1702 against the module boards 1008 can be performed using a spring mechanism, an inflatable mechanism, or other contact mechanisms.

The internal heat diffuser 1702 can have a variety of configurations. For example, the internal heat diffuser 1702 can be formed by a combination of flat diffuser elements coupled to one another. In another example, the internal heat diffuser 1702 can be a rectangular or cylindrical tube shaped that can be in direct contact with the components of the module boards 1008.

The rectangular tube formed by the internal heat diffuser 1702 is smaller than the rectangular tube formed by the module boards 1008. The internal heat diffuser 1702 can fit within the central cavity of the rectangular tube formed by the module boards 1008. The internal heat diffuser 1702 can be secured to the enclosure base 1022, in direct contact with the module boards 1008, or attached to the enclosure end cap 1020.

The internal heat diffuser 1702 increases the amount of computing and memory capacity of the external module system 800 by increasing the cooling capacity of the system. This allows higher capacity memory and computing boards to be used in the system.

The internal heat diffuser 1702 increases the effective working lifetime of the external module system 800 by allowing the electrical components to operate at a lower temperature over time. Reducing the temperature of the components can extend the operational lifetime of the components.

Figure 18:
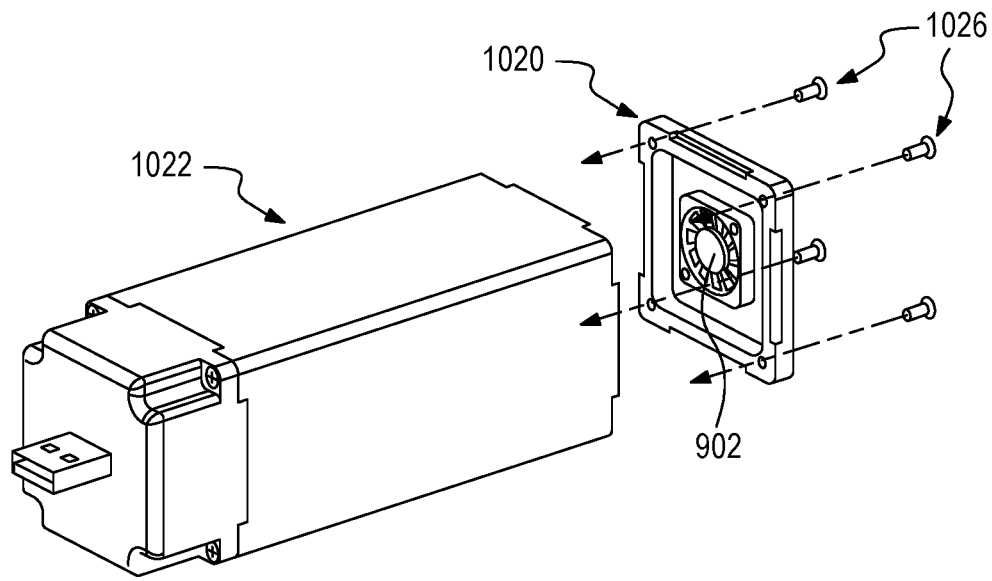
FIG. 18 shows an example of an end cap mounting step of the assembly of the external module system.

Referring now to FIG. 18, therein is shown an example of an end cap mounting step of the assembly of the external module system 800 of FIG. 8. The end cap mounting step shows the attachment of the enclosure end cap 1020 to the enclosure base 1022.

The enclosure end cap 1020 can be attached to the open end of the enclosure base 1022 and secured with the enclosure fasteners 1026. The enclosure end cap 1020 can contact the back ends of the module boards 1008 of FIG. 10 to help secure the module boards 1008 in place and properly connected and seated in the module connectors 1012 of FIG. 10.

The enclosure end cap 1020 can include the cooling unit 902 positioned in the center of the enclosure end cap 1020. The cooling unit 902 can direct the air flow through the middle of the rectangular box formed by the module boards 1008.

2.5. Miscellaneous

Systems 100-800 illustrate only some of many possible arrangements of components configured to provide the functionality described herein. Other arrangements may include fewer, additional, or different components, and the division of work between the components may vary depending on the arrangement. For example, in some embodiments, the systems 100-800 may further include different numbers of the module boards. It is understood that although the systems 100-800 are shown with shown with certain configurations of module boards 108, other configurations are possible. In another example, the systems 100-800 may include four, eight, or larger numbers of the module boards. The module adapter unit and the enclosure can be configured to accommodate different numbers of the module boards.

3.0. IMPLEMENTATION MECHANISM—HARDWARE OVERVIEW

Figure 19:
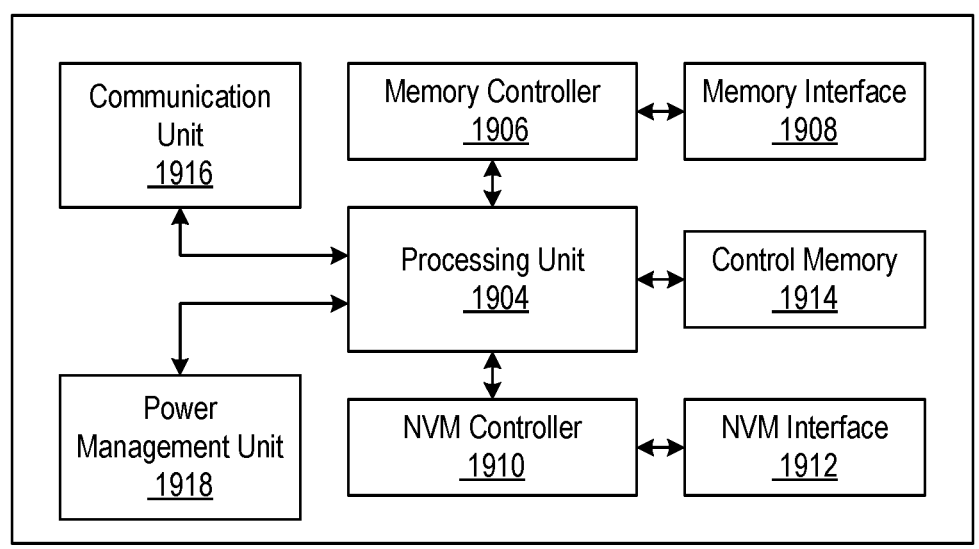
FIG. 19 shows an example of the system board.

Referring now to FIG. 19, therein is shown an example of the system board 116. The system board 116 can provide some of the logic to control the access between the module boards 108 of FIG. 1 and the interface connector 102 of FIG. 1. The system board 116 can control the inter-module communication between the module boards 108.

The system board 116 can include a processing unit 1904 for operating the system board 116. The processing unit 1904 can execute software-based instructions in a control memory 1914 to perform the functions of the system board 116. For example, the processing unit can be a microprocessor, a microcontroller, a finite state machine, or other computing components. The processor unit may alternatively or additionally execute hard-coded instructions in a Field Programmable Gate Array (FPGA), Application-Specific Integrated Circuit (ASIC), or another equivalent component.

The processing unit 1904 may be coupled to a memory controller 1906 for interfacing with the module boards 108. The memory controller 1906 can be coupled to a memory interface 1908 having a direct connection with the module boards 108. The memory controller 1906 may generate the commands to manage the module boards 108. The memory interface 1908 can provide the electrical signals to control the module boards 108.

In an illustrative example, the memory controller 1906 can receive a request to access (e.g. read or write) to an address location (e.g. in an address range that is above the valid address range of any single one of the module boards 108) and translate the address location to an address on one of the module boards 108. The memory controller 1906 can map the received address location to the address location on one of the module boards 108, and trigger a module select line to access the selected one of the module boards 108 is to be used for that particular memory access.

In an embodiment, the processing unit 1904 can be coupled to a non-volatile memory controller 1910 (NVM Controller) for interfacing with non-volatile memory devices, such as one of the module boards 108 configured with Flash memory. The non-volatile memory controller 1910 can be coupled to a non-volatile memory interface 1912 (NVM Interface) having a direct connection with the non-volatile memory of the module boards 108. The non-volatile memory controller 1910 and the non-volatile memory interface 1912 are optional components that are available when non-volatile memory devices are present.

The processing unit 1904 can be coupled to a communication unit 1916 for communicating with the motherboard 124 of FIG. 1. The communication unit 1916, such as a bus controller, a memory channel interface, or similar communication device, can transfer information, such as access requests and data, between the system board 116 and the motherboard 124 via external communication channels.

The processing unit 1904 can be coupled to a power management unit 1918 for managing the power for the system board 116 and the module boards 108. For example, the power management unit 1918 can monitor the power delivered over the memory channel connector 122 of FIG. 1 and react to a power failure.

In an illustrative example, the power management unit 1918 can detect a power failure and signal the processing unit 1904 to initiate a backup of between the module boards 108, where one of the modules is a volatile memory module and the other is a non-volatile memory module.

4.0. FUNCTIONAL OVERVIEW

In an embodiment, a sealed module system or other modular system such as described in other sections, enhances the performance of a host system by providing an interface to module boards within the sealed module system. The sealed module system includes a module adapter unit for communicating over the interface to the host system and a system board for controlling module boards providing additional functionality. For example, the system board can be coupled to one or more memory module boards, forming a memory module system that may be connected to and coupled to the host system. The module adapter unit may be configured to send signals to the motherboard that indicate to the motherboard that the adapter is collectively a single memory module. Further, the sealed module system can include a working fluid within a sealed enclosure for transferring heat from the module boards to an enclosure heat sink for dissipating the heat from the module boards. By using the working fluid to transfer heat away from the module boards, higher performance components can be used while still maintaining the temperature of the sealed module system within operational limits.

In another embodiment, an authentication module system can have a configuration similar to the sealed module system. The authentication module system can include an authentication module system for controlling access to the data and functionality of the authentication module system. The authentication module system can include an authentication sensor to validate the identity of a user of the system to prevent unauthorized usage. For example, the authentication module system can include an authentication sensor such as a fingerprint sensor, camera, or keypad to acquire and validate authentication information from the user of the system.

The authentication module system can receive an authentication value on the authentication sensor of the authentication module system. For example, the authentication value can be a fingerprint, a code entered on a keypad, a facial or iris image, a biometric input, or other unique value to establish identity of the user. The authentication value can then be compared to an internal access validation value to determine if the authentication value is valid. The authentication module system can then allow access to the system based on the identity of the user. Access can be moderated by different degrees of access. This can be implemented on a user by user basis using an access control system such as access control lists, assigned privileges, pre-defined access rights, or other access control systems.

In another embodiment, an external stacked module system or other modular system having an interface connector can include a module adapter unit coupled to a plurality of the module boards. The module boards can implement a variety of features including memory boards, computing boards, co-processor boards, communication boards, power boards, or other similar functionality. The external stacked module system can include a cooling unit within a system enclosure to cool the module boards. By providing enhanced cooling, the external stacked module system can utilize higher performance components that require higher levels of power. The configuration of the module boards can include features for improving the airflow within external stacked module to increase overall cooling capacity.

The external stacked module system can be used to provide additional storage or computing capabilities to the host system. For example, the external stacked module system can be populated with a combination of volatile and non-volatile memory devices, such as M.2 memory boards. Once installed in the external stacked module system and the system enclosure sealed, the external stacked module system can be connected the host system using the interface connector such as a USB connector. The external stacked module system can receive power and communicate with the host system over the interface connector. After the external stacked module system is installed, the system can communicate with the host system and make the memory resources available to the host system. The cooling unit of the external stacked module can provide an airflow against the module boards to provide cooling and heat transfer during operation of the external stacked module system.

In yet another embodiment, an external module system or other modular system having an interface connector can include one or more module boards attached to a module adapter unit. The module boards can implement a variety of features including memory boards, computing boards, co-processor boards, communication boards, power boards, or other similar functionality. The external module system can include a cooling unit attached at the end of a system enclosure to cool the module boards. The module adapter unit and the module boards can be configured around an inner perimeter of the system enclosure, thereby forming a rectangular tube configuration with a central cavity. The cooling unit can be configured to direct an airflow down the center of the system enclosure to cool the module boards. Further, the external module system can include an inner heat diffuser positioned within the rectangular tube configuration to improve cooling by directly the airflow against the module boards. The inner heat diffuser can also be configured with thermal pads in direct contact with the module boards to provide additional conductive thermal transport. By providing enhanced cooling, the external stacked module system can utilize higher performance components that require higher levels of power.

The external module system can be used to provide additional storage or computing capabilities to the host system. For example, the external module system can be populated with a combination of volatile and non-volatile memory devices, such as M.2 memory boards. Once installed in the external stacked module system and the system enclosure sealed, the external module system can be connected to the host system using the bridge unit and the interface connector such as a USB connector. The bridge interface unit can interface between the USB interface and internal bus coupled to the M.2 memory boards. The external module system can receive power and communicate with the host system over the interface connector. After the external module system is installed, the system can communicate with the host system and make the memory resources available to the host system. The cooling unit of the external module can provide an airflow that can be directed against the module boards by the internal heat diffuser to provide cooling and heat transfer during operation of the external module system.

4.1. Manufacturing Flow

Figure 20:
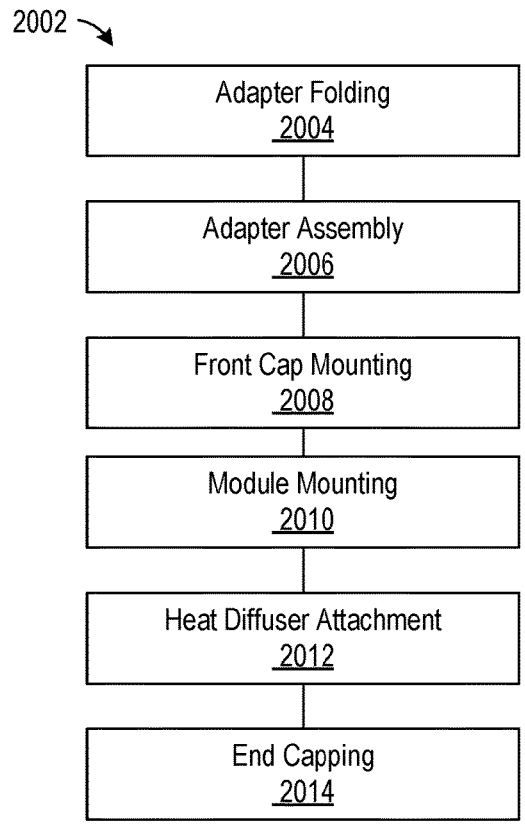
FIG. 20 shows an example of a manufacturing flow of the external module system.

Referring now to FIG. 20, therein is shown an example of a manufacturing flow 2002 of the external module system 800 of FIG. 8. The manufacturing flow 2002 describes the some of the steps used in in the manufacture of an external module system, such as the external module system 800, configured to operate as described herein.

The external module system can be manufactured in a variety of ways. For example, the manufacturing flow 2002 may include an adapter folding step 2004, an adapter assembly step 2006, a front capping step 2008, a module board mounting step 2010, a diffuser attachment step 2012, and an end capping step 2014.

In the adapter folding step 2004, the module adapter unit 1006 of FIG. 10 can be folded to have the module connectors 1012 of FIG. 10 point in a direction away from the system board 1016 of FIG. 10. The module connectors 1012 are attached to the module connector boards 1014 of FIG. 10 with the flexible connector 1024 of FIG. 10. The flexible connectors 1024 can be folded at approximately right angles to allow each of the module connectors 1012 to face in a single direction. This configuration allows the module adapter unit 1006 to fit within the enclosure base 1022 of FIG. 10 and be connected to the module boards 1008.

In the adapter assembly step 2006, the module adapter unit 1006 has been folded and can be inserted into the enclosure base 1022 with the module connector boards 1014 pointing into the enclosure base 1022 and the module connectors 1012 aligned with the module guide 1030 of FIG. 10 to accommodate the mounting of the module boards 1008. The bridge interface unit 1034 of FIG. 10 is mounted on the system board 1016 and is oriented pointing away from the enclosure base 1022.

In the front capping step 2008, the interface connector 802 of FIG. 8 is attached to the bridge interface unit 1034 and the enclosure front cap 1018 of FIG. 10 is attached to the enclosure base 1022. The enclosure front cap 1018 is mounted over the interface connector 802 and the interface connector 802 extend out of an opening in the enclosure front cap 1018. The enclosure front cap 1018 is mounted to the enclosure base 1022 with the enclosure fasteners 1026. The enclosure fasteners 1016 can be screws, bolts, adhesives, or other similar fasteners. In some configurations, the enclosure fasteners 1016 can be removable.

In the module board mounting step 2010, the module boards 1008 attached to the module connectors 1012 of the module connector boards 1014. The module boards 1008 can be inserted into the module guides 1030 to guide them into position relative to the module connectors 1012. Depending on the number of the module boards 1008 that are desired, the module boards 1008 can be inserted into the module guides 1030 around the inner perimeter of the enclosure base 1022. In an alternative example, additional ones of the module boards 1008 can be attached to the module connectors 1012 directly mounted on the system board 1016.

In an illustrative example, the module board mounting step 2010 can be implemented for different configurations of the module system. In the case of the external stacked module system 400 of FIG. 4, the module boards 608 of FIG. 6 can be mounted on the module connectors 624 in a stacked configuration. In the case of the sealed module system 100 of FIG. 1, the module boards 108 can also be mounted to the module connectors 107 of FIG. 1 in a stacked configuration.

In the diffuser attachment step 2012, the internal heat diffuser 1702 can be inserted into the enclosure base 1022 to increase the cooling efficiency of the external module system 800. The internal heat diffuser 1702 can be positioning in the rectangular tube formed by the module boards 1008. The diffuser openings 1704 in the internal heat diffuser 1702 can redirect the airflow in the rectangular tube against the module boards 1008 to improve cooling effectiveness. The internal heat diffuser 1702 can include the thermal pads 1706 in contact with the components of the module boards 1008 to transfer heat to the internal heat diffuser 1702 for further dissipation in the air flow of the rectangular tube.

The internal heat diffuser 1702 can be attached to the enclosure base 1022, the module adapter unit 1006, the enclosure end cap 1020, or directly on the components of the module boards 1008. The internal heat diffuser 1702 can be configured as individual flat elements similar in size to the module boards 1008, a complete rectangular or cylindrical structure, or other similar structures. The internal heat diffuser 1702 is sized to fit within the rectangular tube formed by the module boards 1008 within the enclosure base 1022.

In the end capping step 2014, the enclosure end cap 1020 can be attached to the enclosure base 1022. The enclosure end cap 1020 can include the cooling unit 902 positioned to direct the airflow down the center space of the enclosure base 1022. The enclosure end cap 1020 can be attached to the enclosure base 1022 using enclosure fasteners 1026.

4.2. Operation Flow

Figure 21:
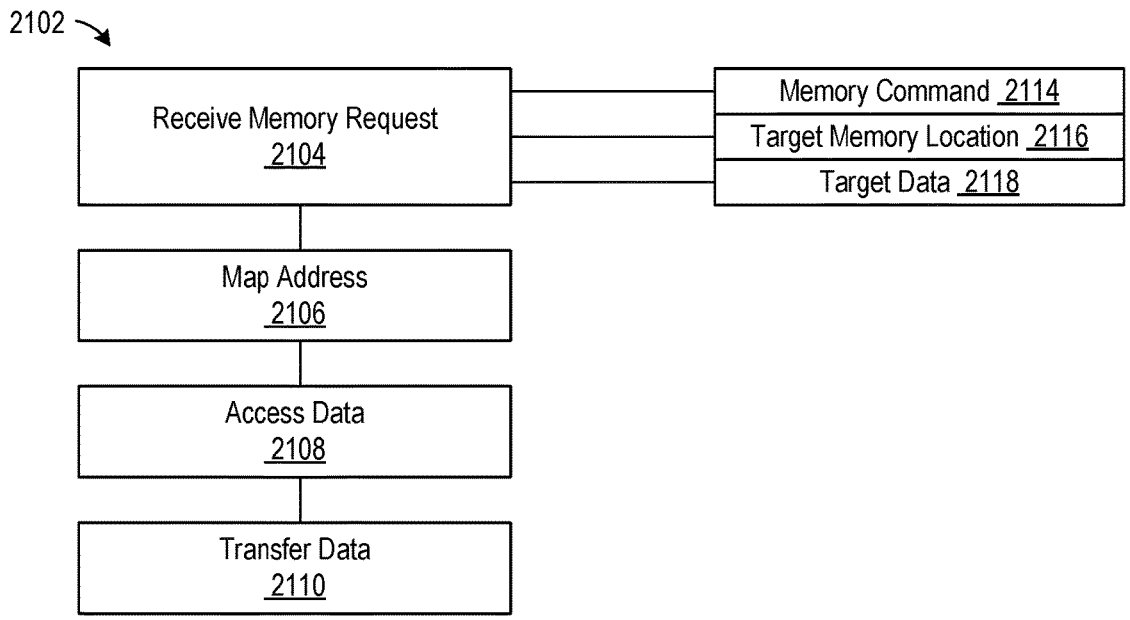
FIG. 21 shows an example of an operation flow of the external module system.

Referring now to FIG. 21, therein is shown an example of an operation flow 2102 of the external module system 800 of FIG. 8 according to an embodiment. The operation flow 2102 describes some of the steps used in the operation of the portable module system, such as the external module system 800, configured to operate as described herein.

The external module system 800 can be operated in a variety of ways based on the configuration of the module boards 1008 of FIG. 10. In an illustrative example, the external module system 800 can be Redundant Array of Inexpensive Discs (RAID) unit. The module boards 1008 can include a RAID memory controller and additional non-volatile memory boards, such as Flash Memory Solid State Drives (SSD). In this example, the operation flow 2102 may perform steps including a receive memory request step 2104, a map address step 2106, an access data step 2108, and a transfer data step 2110.

In the receive command step 2104, the external module system 800 can receive a memory command 2114 from the host system (not shown). The memory command 2114 can be received by the system board 1016 via the interface connector 802 and the bridge interface unit 1034 from the external bus 810. The host system can communicate with the external module system 800 via the external bus 810 and access the data on the module boards 1008 that are coupled to the internal bus 1040.

The memory command 2114 can include a memory operation to be performed, a target memory location 2116, and target data 2118. For example, the memory command 2114 can be a write memory command to write the target data 2118 at the target memory location 2116.

In a map address step 2106, the external module system 800 can use the RAID controller can decode the target memory location 2116 and determine the physical memory locations on the non-volatile memory boards. The RAID controller and the non-volatile memory boards are coupled together via the internal bus 1040, such as a M.2 bus, a SATA bus, a SCSI bus, a SAS bus, or a similar bus structure.

In an access data step 2108, the external module system 800 can execute the memory command 2114. If the memory command 2114 is a memory read operation, then the target data 2118 can be read from the physical locations determined in the map address step 2106. The target data 2118 on the module boards 1008 can accessed using the internal bus 1040.

In a transfer data step 2110, the external module system 800 can transfer the target data 2118 from the module boards 1008 to the host system via the external bus 810. The bridge interface unit 1034 can receive the target data 2118 from the module boards 1008 on the internal bus 1040 and send the target data 2118 to the external bus 810. The bridge interface unit 1034 can facilitate the data transfer by converting the protocol of the internal bus 1040 to the external bus 810.

The various elements of the operation flow 2102 may be performed in a variety of systems, including systems such as external module system 800 described above. In another embodiment, each of the processes described in connection with the functional blocks described below may be implemented using one or more computer programs, other software elements, and/or digital logic in the system board 1016, while performing data retrieval, transformation, and storage operations that involve interacting with and transforming the physical state of memory of the computer.

5.0. EXAMPLE EMBODIMENTS

Examples of some embodiments are represented, without limitation, in the following clauses.

According to an embodiment, a method of manufacture of a portable module system comprising mounting a module adapter unit within an enclosure, the module adapter unit having one or more module connectors coupled to an internal bus, coupling module boards to the internal bus via the module connectors, connecting an interface connector to the module adapter unit, the interface connector configured to couple with an external bus, and the interface connector having a power line powering the module adapter unit and the module boards, and coupling a bridge interface unit to the module adapter unit, the bridge interface unit configured to couple the internal bus to the external bus.

In an embodiment, the method further comprises coupling the module boards includes the coupling the module connectors to the module adapter unit with flexible connectors, and the flexible connectors are folded at a right angle to orient the module connectors in the same direction.

The method as claimed in claim 1 wherein coupling the module boards includes coupling the module connectors to the module adapter unit in a stacked configuration with one or more of the module boards connected to the module connectors and at least one of the module boards parallel to another of the module boards.

In an embodiment, the method further comprises mounting the module adapter unit includes configuring a cooling unit in the enclosure to direct an airflow against the module boards.

In an embodiment, the method further comprises coupling the module boards includes configuring the module boards with airflow channeling elements to direct the airflow within the enclosure.

According to an embodiment, a method of manufacture of a portable module system comprising mounting a module adapter unit within an enclosure, the module adapter unit having one or more module connectors coupled to an internal bus, coupling module boards to the internal bus via the module connectors, configuring one or more of the module boards as memory boards, configuring one of the module boards as a memory controller for controlling the memory boards, connecting an interface connector to the module adapter unit, the interface connector configured to couple with an external bus, and the interface connector having a power line powering the module adapter unit and the module boards; and coupling a bridge interface unit to the module adapter unit, the bridge interface unit configured to couple the internal bus to the external bus.

In an embodiment, the method further comprises mounting an internal heat diffuser between two of the module boards, the internal heat diffuser having diffuser airflow elements to direct the airflow from the cooling unit, and the internal heat diffuser having thermal pads in contact with the module boards configured to cool the module boards.

In an embodiment, the method further comprises mounting the module adapter unit includes filling the enclosure is filled with an electrically non-conductive working fluid and sealing the enclosure with a waterproof seal.

In an embodiment, the method further comprises coupling the module boards includes the module boards includes positioning the module boards in module guides attached to the enclosure.

In an embodiment, the method further comprises coupling the module boards includes mounting the module boards around an inner perimeter of the enclosure to form a rectangular tube having a central cavity.

A portable module system comprising a module adapter unit within an enclosure, one or more module connectors coupled to the module adapter unit with the module connectors coupled to an internal bus, module boards coupled to the internal bus via the module connectors, an interface connector coupled to the module adapter unit, the interface connector configured to couple with an external bus, and the interface connector having a power line powering the module adapter unit and the module boards, and a bridge interface unit coupled to the module adapter unit, the bridge interface unit configured to couple the internal bus to the external bus.

In an embodiment, the system further comprises the module connectors are coupled to the module adapter unit with flexible connectors, and the flexible connectors are folded at a right angle to orient the module connectors in the same direction.

In an embodiment, the system further comprises the module connectors are coupled to the module adapter unit in a stacked configuration with one or more of the module boards connected to the module connectors and at least one of the module boards parallel to another of the module boards.

In an embodiment, the system further comprises a cooling unit, coupled to the enclosure, is configured to direct an airflow against the module boards.

In an embodiment, the system further comprises the module boards include airflow channeling elements to direct the airflow within the enclosure.

In an embodiment, the system further comprises one or more of the module boards are configured as memory boards and one of the module boards is configured as a memory controller for controlling the memory boards.

In an embodiment, the system further comprises an internal heat diffuser between two of the module boards, the internal heat diffuser having diffuser airflow elements to direct the airflow from the cooling unit, and the internal heat diffuser having thermal pads in contact with the module boards configured to cool the module boards.

In an embodiment, the system further comprises a thermal sensor coupled to the system board, the thermal sensor configured control the cooling unit based on an internal temperature of the portable module system.

In an embodiment, the system further comprises the module boards are positioned in module guides attached to the enclosure.

In an embodiment, the system further comprises the module boards are mounted around an inner perimeter of the enclosure to form a rectangular tube having a central cavity.

Other examples of these and other embodiments are found throughout this disclosure.

6.0. EXTENSIONS AND ALTERNATIVES

As used herein, the terms "first," "second," "certain," and "particular" are used as naming conventions to distinguish queries, plans, representations, steps, objects, devices, or other items from each other, so that these items may be referenced after they have been introduced. Unless otherwise specified herein, the use of these terms does not imply an ordering, timing, or any other characteristic of the referenced items.

In the drawings, the various components are depicted as being communicatively coupled to various other components by arrows. These arrows illustrate only certain examples of information flows between the components. Neither the direction of the arrows nor the lack of arrow lines between certain components should be interpreted as indicating the existence or absence of communication between the certain components themselves. Indeed, each component may feature a suitable communication interface by which the component may become communicatively coupled to other components as needed to accomplish any of the functions described herein.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. In this regard, although specific claim dependencies are set out in the claims of this application, it is to be noted that the features of the dependent claims of this application may be combined as appropriate with the features of other dependent claims and with the features of the independent claims of this application, and not merely according to the specific dependencies recited in the set of claims. Moreover, although separate embodiments are discussed herein, any combination of embodiments and/or partial embodiments discussed herein may be combined to form further embodiments.

Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method of manufacture of a portable module system comprising:
    mounting a module adapter unit within an enclosure, the module adapter unit having one or more module connectors coupled to an internal bus;
    coupling module boards to the internal bus via the module connectors;
    connecting an interface connector to the module adapter unit, the interface connector configured to couple with an external bus, and the interface connector having a power line powering the module adapter unit and the module boards;
    coupling a bridge interface unit to the module adapter unit, the bridge interface unit configured to couple the internal bus to the external bus; and
    filling the enclosure with an electrically non-conductive working fluid and sealing the enclosure to prevent leakage of the electrically non-conductive working fluid.

2. The method as claimed in claim 1 wherein coupling the module boards includes the coupling the module connectors to the module adapter unit with flexible connectors, and the flexible connectors are folded at a right angle to orient the module connectors in the same direction.

3. The method as claimed in claim 1 wherein coupling the module boards includes coupling the module connectors to the module adapter unit in a stacked configuration with one or more of the module boards connected to the module connectors and at least one of the module boards parallel to another of the module boards.

4. The method as claimed in claim 1 wherein mounting the module adapter unit includes configuring a cooling unit in the enclosure to direct an airflow against the module boards.

5. The method as claimed in claim 1 wherein coupling the module boards includes configuring the module boards with airflow channeling elements to direct the airflow within the enclosure.

6. A method of manufacture of a portable module system comprising:
    mounting a module adapter unit within an enclosure, the module adapter unit having one or more module connectors coupled to an internal bus;
    coupling module boards to the internal bus via the module connectors;
    configuring one or more of the module boards as memory boards;
    configuring one of the module boards as a memory controller for controlling the memory boards;
    connecting an interface connector to the module adapter unit, the interface connector configured to couple with an external bus, and the interface connector having a power line powering the module adapter unit and the module boards;
    coupling a bridge interface unit to the module adapter unit, the bridge interface unit configured to couple the internal bus to the external bus; and
    filling the enclosure with an electrically non-conductive working fluid and sealing the enclosure to prevent leakage of the electrically non-conductive working fluid.

7. The method as claimed in claim 6 further comprising mounting an internal heat diffuser between two of the module boards, the internal heat diffuser having diffuser airflow elements to direct the airflow from the cooling unit, and the internal heat diffuser having thermal pads in contact with the module boards configured to cool the module boards.

8. The method as claimed in claim 6 wherein coupling the module boards includes the module boards includes positioning the module boards in module guides attached to the enclosure.

9. The method as claimed in claim 6 wherein coupling the module boards includes mounting the module boards around an inner perimeter of the enclosure to form a rectangular tube having a central cavity.

10. A portable module system comprising:
    a module adapter unit within an enclosure filled with an electrically non-conductive working fluid and the enclosure sealed to prevent leakage of the electrically non-conductive working fluid;
    one or more module connectors coupled to the module adapter unit with the module connectors coupled to an internal bus;
    module boards coupled to the internal bus via the module connectors;
    an interface connector coupled to the module adapter unit, the interface connector configured to couple with an external bus, and the interface connector having a power line powering the module adapter unit and the module boards; and
    a bridge interface unit coupled to the module adapter unit, the bridge interface unit configured to couple the internal bus to the external bus.

11. The system as claimed in claim 10 wherein the module connectors are coupled to the module adapter unit with flexible connectors, and the flexible connectors are folded at a right angle to orient the module connectors in the same direction.

12. The system as claimed in claim 10 wherein the module connectors are coupled to the module adapter unit in a stacked configuration with one or more of the module boards connected to the module connectors and at least one of the module boards parallel to another of the module boards.

13. The system as claimed in claim 10 further comprising a cooling unit, coupled to the enclosure, is configured to direct an airflow against the module boards.

14. The system as claimed in claim 10 wherein the module boards include airflow channeling elements to direct the airflow within the enclosure.

15. The system as claimed in claim 10 wherein:
    one or more of the module boards are configured as memory boards; and
    one of the module boards is configured as a memory controller for controlling the memory boards.

16. The system as claimed in claim 15 further comprising an internal heat diffuser between two of the module boards, the internal heat diffuser having diffuser airflow elements to direct the airflow from the cooling unit, and the internal heat diffuser having thermal pads in contact with the module boards configured to cool the module boards.

17. The system as claimed in claim 15 further comprising a thermal sensor coupled to the system board, the thermal sensor configured control the cooling unit based on an internal temperature of the portable module system.

18. The system as claimed in claim 15 wherein the module boards are positioned in module guides attached to the enclosure.

19. The system as claimed in claim 15 wherein the module boards are mounted around an inner perimeter of the enclosure to form a rectangular tube having a central cavity.

* * * * *